(12) United States Patent
Maeda et al.

(10) Patent No.: US 12,191,848 B2
(45) Date of Patent: Jan. 7, 2025

(54) CONTROL CIRCUIT AND SWITCH DEVICE

(71) Applicant: Panasonic Intellectual Property Management Co., Ltd., Osaka (JP)

(72) Inventors: Ryosuke Maeda, Osaka (JP); Yusuke Kinoshita, Kyoto (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 109 days.

(21) Appl. No.: 17/916,743

(22) PCT Filed: Apr. 5, 2021

(86) PCT No.: PCT/JP2021/014530
§ 371 (c)(1),
(2) Date: Oct. 3, 2022

(87) PCT Pub. No.: WO2021/206065
PCT Pub. Date: Oct. 14, 2021

(65) Prior Publication Data
US 2023/0145803 A1   May 11, 2023

(30) Foreign Application Priority Data

Apr. 7, 2020 (JP) .............................. 2020-069303
Apr. 24, 2020 (JP) .............................. 2020-077832

(51) Int. Cl.
*H03K 17/16* (2006.01)
*H02H 3/20* (2006.01)

(52) U.S. Cl.
CPC .......... *H03K 17/166* (2013.01); *H02H 3/202* (2013.01)

(58) Field of Classification Search
CPC .............................. H03K 17/166; H02H 3/202
(Continued)

(56) References Cited

U.S. PATENT DOCUMENTS

| 5,926,012 A | 7/1999 | Takizawa et al. |
| 8,669,789 B2 * | 3/2014 | Tsukada ............. H03K 17/0828 327/108 |

(Continued)

FOREIGN PATENT DOCUMENTS

| EP | 3879685 A1 | 9/2021 |
| JP | H01-298949 A | 12/1989 |

(Continued)

OTHER PUBLICATIONS

International Search Report dated Jul. 6, 2021 issued in International Patent Application No. PCT/JP2021/014530, with English translation.

*Primary Examiner* — Ryan Johnson
*Assistant Examiner* — Colleen J O Toole
(74) *Attorney, Agent, or Firm* — Rimon P.C.

(57) ABSTRACT

A control circuit controls a switching element including a gate and a source corresponding to the gate. The control circuit includes an inductor, a circuit element, and a resistor. The inductor is connected between the gate and the source of the switching element. The circuit element is connected in series to the inductor between the gate and the source. The circuit element allows an electric current to flow therethrough in response to generation of electromotive force in the inductor. The resistor is connected in parallel to the inductor and the circuit element between the gate and the source.

16 Claims, 28 Drawing Sheets

(58) Field of Classification Search
USPC .......................................................... 327/380
See application file for complete search history.

(56) References Cited

U.S. PATENT DOCUMENTS

| | | | | |
|---|---|---|---|---|
| 8,816,725 | B2* | 8/2014 | Steeneken | H03K 17/102 |
| | | | | 327/108 |
| 10,128,832 | B2* | 11/2018 | Xu | H03K 17/56 |
| 2012/0032709 | A1* | 2/2012 | Saotome | H03K 17/04206 |
| | | | | 327/109 |
| 2012/0256493 | A1 | 10/2012 | Saito | |

FOREIGN PATENT DOCUMENTS

| | | | |
|---|---|---|---|
| JP | H04-296116 | A | 10/1992 |
| JP | H10-150764 | A | 6/1998 |
| JP | H10-229671 | A | 8/1998 |
| JP | 2012-222932 | A | 11/2012 |
| WO | 2020/095351 | A1 | 5/2020 |

* cited by examiner

CONTROL CIRCUIT AND SWITCH DEVICE

CROSS-REFERENCE OF RELATED APPLICATIONS

This application is the U.S. National Phase under 35 U.S.C. § 371 of International Patent Application No. PCT/JP2021/014530, filed on Apr. 5, 2021, which in turn claims the benefit of Japanese Patent Application No. 2020-069303, filed on Apr. 7, 2020, and Japanese Patent Application No. 2020-077832, filed on Apr. 24, 2020, the entire disclosures of which Applications are incorporated by reference herein.

TECHNICAL FIELD

The present disclosure generally relates to a control circuit and a switch device, and more particularly relates to a control circuit for controlling a switching element and a switch device including such a control circuit.

BACKGROUND ART

Patent Literature 1 proposes a bidirectional switch circuit with the ability to reduce overvoltage applied to a switching transistor.

In the exemplary bidirectional switch circuit disclosed in Patent Literature 1, a reactor is inserted between the respective sources of two switching transistors. In addition, between the gate and source of each switching transistor, a diode is connected as an electromotive force supply element to have polarity that prevents a gate drive voltage from being applied to each switching transistor. A drive voltage for a gate driver circuit is supplied via a series resistor to between a first control terminal that is connected to a common gate of the two switching transistors and a second control terminal connected to an intermediate tap of the reactor.

A control circuit for controlling a semiconductor switch (switching element) is sometimes required to reduce a surge voltage applied to the semiconductor switch while cutting down the switching loss involved when the semiconductor switch turns OFF.

CITATION LIST

Patent Literature

Patent Literature 1: JP H04-296116 A

SUMMARY OF INVENTION

To overcome such a problem, it is an object of the present disclosure to provide a control circuit and a switch device that may be expected to reduce a surge voltage applied to a switching element while cutting down the switching loss involved when the switching element turns OFF.

A control circuit according to an aspect of the present disclosure is a control circuit for controlling a switching element including a gate and a source corresponding to the gate. The control circuit includes an inductor, a circuit element, and a resistor. The inductor is connected between the gate and the source of the switching element. The circuit element is connected in series to the inductor between the gate and the source. The circuit element allows an electric current to flow therethrough in response to generation of electromotive force in the inductor. The resistor is connected in parallel to the inductor and the circuit element between the gate and the source.

A switch device according to another aspect of the present disclosure includes the control circuit described above and the switching element described above.

DESCRIPTION OF EMBODIMENTS

First Embodiment

Figure 2:
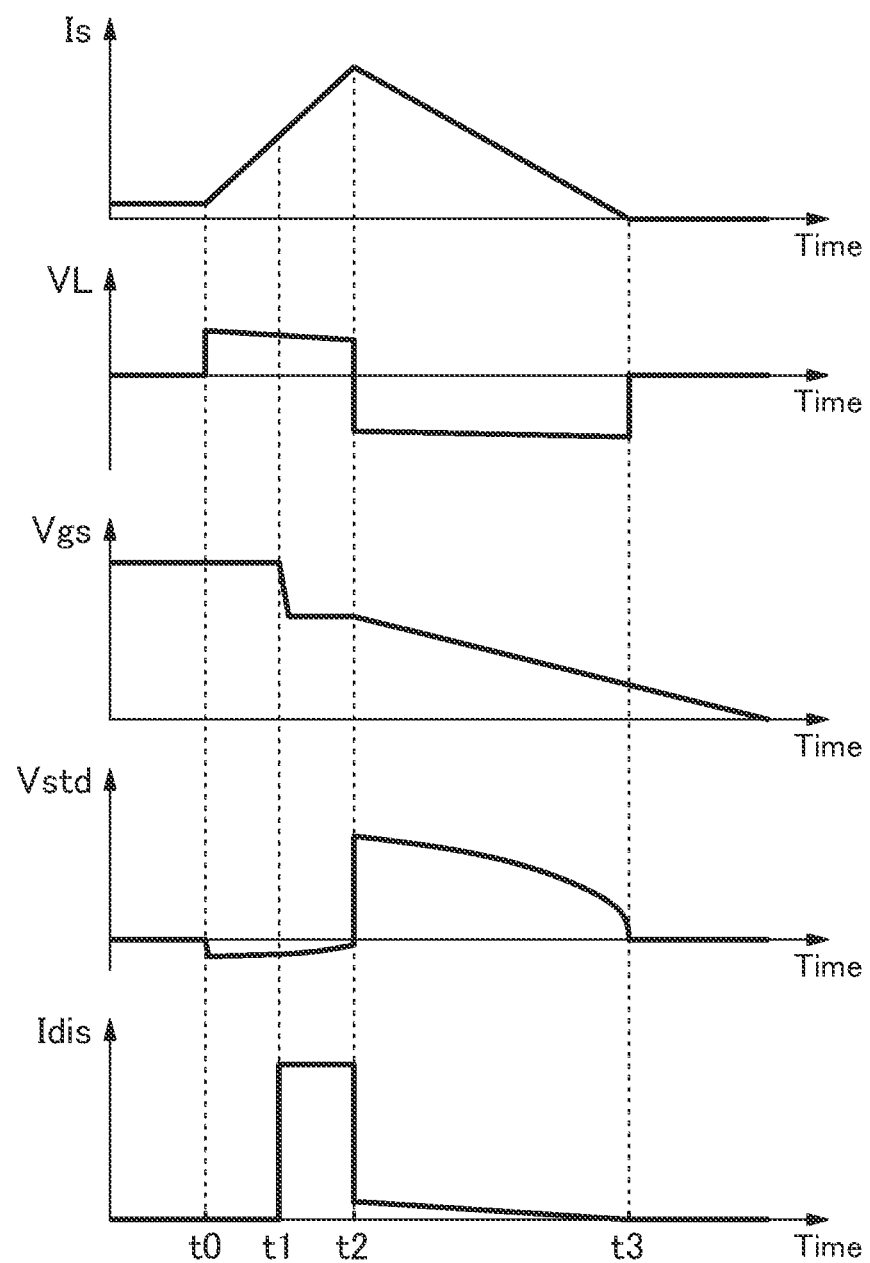
FIG. 2 illustrates how voltages and currents change with time at respective points on the control circuit.
Figure 3:
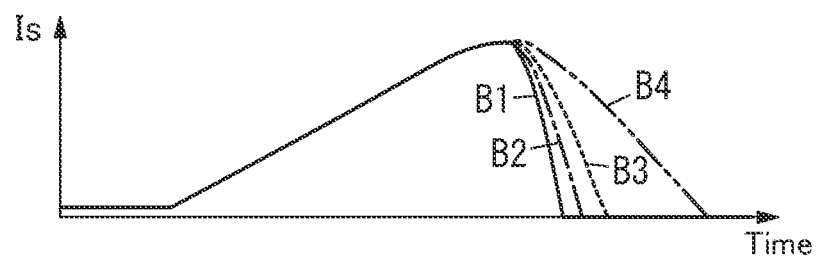
FIG. 3 is a graph illustrating how a source current flowing through a switching element of the switch device including the control circuit changes with time as its parameter is varied.

A control circuit 10 according to an exemplary embodiment and a switch device 100 including the control circuit 10 will be described with reference to FIGS. 1-3.

(1) Overview

Figure 1:
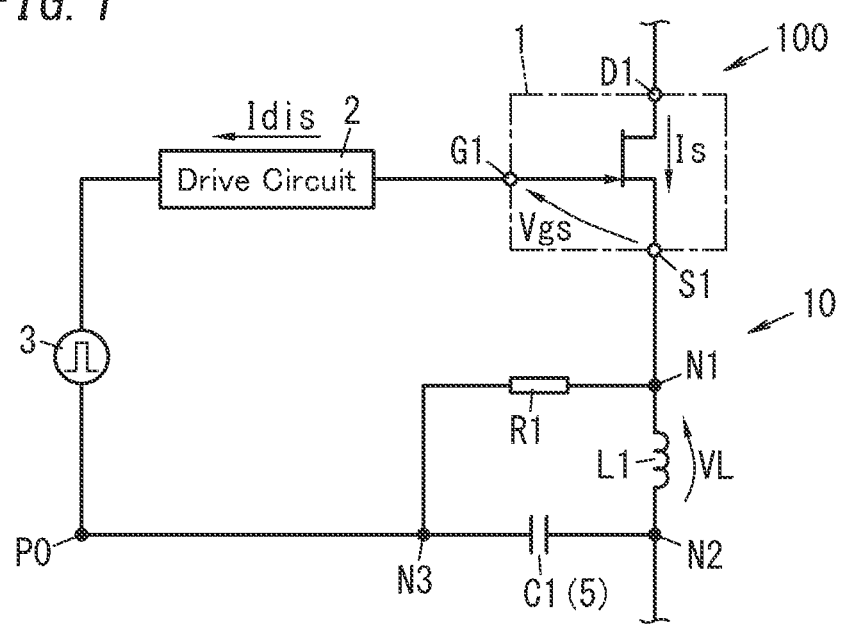
FIG. 1 is a circuit diagram of a switch device including a control circuit according to a first embodiment.

As shown in FIG. 1, the control circuit 10 is a control circuit for controlling a switching element 1 including a gate G1 and a source S1 corresponding to the gate G1. The switching element 1 includes not only the gate G1 and the source S1 but also a drain D1 as well. The control circuit 10 includes: an inductor L1 connected between the gate G1 and the source S1 of the switching element 1; and a circuit element 5 connected in series to the inductor L1 between the gate G1 and the source S1 and turning electrically conductive in response to generation of electromotive force in the inductor L1. As used herein, if the circuit element 5 "turns electrically conductive in response to generation of electromotive force in the inductor L1," this phrase means that an electric current flows through the circuit element 5 when electromotive force is generated in the inductor L1 to make the potential at a second terminal, which is located opposite from a first terminal connected to the source S1 of the switching element 1, higher than the potential at the first terminal. In other words, if the circuit element 5 "turns electrically conductive in response to generation of electromotive force in the inductor L1," this phrase means that an electric current flows through the circuit element 5 in response to generation of counter electromotive force in the inductor L1. The control circuit 10 further includes a resistor R1 connected in parallel to the inductor L1 and the circuit element 5 between the gate G1 and the source S1.

The inductor L1 generates electromotive force (induced electromotive force) in accordance with a current variation rate (di/dt=dIs/dt) of a source current Is that is a principal current of the switching element 1 when the switching element 1 turns OFF. In this case, the source current Is that is the principal current of the switching element 1 is an electric current that flows from the drain D1 to the source S1 of the switching element 1. That is to say, the source current Is is the same current as the drain current.

The circuit element 5 allows an electric current to flow therethrough in response to generation of electromotive force in the inductor L1 according to the current variation rate of the source current Is when the source current Is decreases. The circuit element 5 is, for example, a capacitor C1.

The resistor R1 is connected in parallel to the inductor L1 and the circuit element 5. In other words, the resistor R1 is connected in parallel to a series circuit including the inductor L1 and the circuit element 5. The control circuit 10 includes the resistor R1, and therefore, may generate a potential difference between the terminals of the resistor R1. Thus, the control circuit 10 may make the reference potential of the potential at the gate G1 of the switching element 1 (i.e., gate potential) and the reference potential of the potential at the source S1 of the switching element 1 (i.e., source potential) different from each other.

The switch device 100 includes the control circuit 10 and the switching element 1. In the switch device 100, a load circuit including a series circuit of a load and a power supply, for example, may be connected between the drain D1 and source S1 of the switching element 1. More specifically, in the switch device 100, the load circuit including the load and the power supply may be connected between a first terminal, which is one terminal of a series circuit of the switching element 1 and the inductor L1, and a second terminal, which is the other terminal thereof. Note that the load and the power supply are not constituent elements of the switch device 100.

(2) Configuration (2-1) Switching Element

The switching element 1 is, for example, a GaN-based semiconductor switching element. More specifically, the switching element 1 is a junction field effect transistor (JFET). The JFET serving as the switching element 1 is, for example, a GaN-based gate injection transistor (GIT).

The switching element 1 includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. In the switching element 1, a diode structure is formed by the second nitride semiconductor layer and the p-type layer. The gate G1 of the switching element 1 includes the gate electrode and the p-type layer. The source S1 of the switching element 1 includes the source electrode. The drain D1 of the switching element 1 includes the drain electrode. The substrate is a silicon substrate, for example. The buffer layer is an undoped GaN layer, for example. The first nitride semiconductor layer is, for example, an undoped GaN layer. The second nitride semiconductor layer is, for example, an undoped AlGaN layer. The p-type layer is, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

(2-2) Switch Device

As shown in FIG. 1, the switch device 100 includes the switching element 1, the control circuit 10, a drive circuit 2, and a driver 3. The control circuit 10 according to the first embodiment includes the inductor L1, the capacitor C1 serving as a circuit element 5, and the resistor R1 as described above.

The driver 3 has a high-potential output terminal and a low-potential output terminal. In this switch device 100, the high-potential output terminal of the driver 3 is connected to the gate G1 of the switching element 1 via the drive circuit 2. The drive circuit 2 includes, for example, a gate resistor connected between the high-potential output terminal of the driver 3 and the gate G1 of the switching element 1. The low-potential output terminal of the driver 3 is connected to the source S1 of the switching element 1 via the resistor R1. The driver 3 is a driver which may apply not only a positive bias voltage but also a negative bias voltage to between the gate G1 and source S1 of the switching element 1. The driver 3 is a driver which includes, for example, a DC power supply and a complementary metal-oxide semiconductor (CMOS) inverter and which may change the output voltage within the range from −12 V to 18 V.

The source S1 of the switching element 1 is connected to a first terminal of the inductor L1 and a first terminal of the resistor R1. The first terminal of the resistor R1 is connected to a node N1 on the path between the source S1 of the switching element 1 and the first terminal of the inductor L1. The gate G1 of the switching element 1 is connected to the high-potential output terminal of the driver 3 via the drive circuit 2. A first terminal of the capacitor C1 is connected to the second terminal of the inductor L1. The capacitor C1 is connected to a node N2 on the path between the inductor L1 and a second terminal to be connected to the load circuit described above. The second terminal of the capacitor C1 is connected to a node N3 on the path between the resistor R1 and the gate G1 of the switching element 1. More specifically, the second terminal of the capacitor C1 is connected to the second terminal of the resistor R1 and the low-potential output terminal of the driver 3. The resistor R1 is connected in parallel to the inductor L1 and the capacitor C1. That is to say, the resistor R1 is connected in parallel to a series circuit of the inductor L1 and the capacitor C1. It can be said that the node N3 is a point of connection between the resistor R1 and the circuit element 5. In the following description, an arbitrary point on the path between the node N3 and the low-potential output terminal of the driver 3 will be hereinafter referred to as a "reference potential point P0" and the potential at the reference potential point P0 will be hereinafter referred to as a "reference potential Vstd" for the sake of convenience of description.

(3) Operation

Next, it will be described with reference to FIGS. 1-3 how the switch device 100 operates.

In the following description, the voltage between the gate G1 and source S1 of the switching element 1 will be hereinafter referred to as a "gate-source voltage Vgs" and an electric current flowing from the gate G1 of the switching element 1 to the drive circuit 2 will be hereinafter referred to as a "discharge current Idis."

In the switch device 100, while a positive bias voltage is applied from the driver 3 to between the gate G1 and source S1 of the switching element 1 to make the gate-source voltage Vgs of the switching element 1 equal to or higher than the threshold voltage of the switching element 1, the switching element 1 is ON state. To turn the switching element 1 OFF, the switch device 100 changes the output voltage of the driver 3 from the positive bias voltage into 0 V (or a negative bias voltage), for example. As a result, in the switch device 100, the source current Is, the electromotive force VL of the inductor L1, the gate-source voltage Vgs, the reference potential Vstd, and the discharge current Idis change as shown in FIG. 2. In FIG. 2, t0 is a point in time when the output voltage of the driver 3 is changed from the positive bias voltage into 0 V (or a negative bias voltage), for example, in the switch device 100, t1 is a point in time when the discharge current Idis starts to flow, t2 is a point in time when the source current Is of the switching element 1 that has been increasing starts to decrease, and t3 is a point in time when the source current Is becomes equal to zero.

In the switch device 100, right after the switching element 1 has started to turn OFF, the potential at the source S1 and the electromotive force of the inductor L1 are 0 V and the reference potential Vstd is approximately equal to the source potential, i.e., 0 V.

In the switch device 100, until the point in time t2 when the source current Is that has been increasing starts to decrease, the gate G1 of the switching element 1 is discharged via the drive circuit 2, and therefore, the discharge current Idis flows from the gate G1. At this time, in the switch device 100, the gate-source voltage Vgs of the switching element 1 decreases steeply and then becomes substantially constant.

In the switch device 100, once the source current Is has started to decrease at the point in time t2, the current value of the discharge current Idis decreases and the rate of decrease in the gate potential slows down, thus enabling decreasing the variation rate (dIs/dt) of the source current Is and thereby reducing the surge voltage applied to the switching element 1.

In the switch device 100, the induced electromotive force VL generated in the inductor L1 as the source current Is decreases causes an increase in the reference potential Vstd via the capacitor C1. More specifically, in the control circuit 10, the induced electromotive force generated in the inductor L1 as the source current Is decreases makes the potential at the second terminal of the inductor L1 higher than the potential at the first terminal thereof, thus making the potential at the node N2 higher than the potential at the source S1. As a result, an electric current flows through a closed-loop circuit including the inductor L1, the capacitor C1, and the resistor R1. That is to say, in the control circuit 10, the electric current flows through the capacitor C1 as the circuit element 5 (i.e., the capacitor C1 as a circuit element 5 turns electrically conductive). Consequently, in the switch device 100, the reference potential Vstd becomes higher than the potential at the source S1 to decrease the potential difference between the gate potential and the reference potential Vstd. Thus, the current value of the discharge current Idis flowing from the gate G1 of the switching element 1 decreases to slow down the rate of decrease in the source current Is. As a result, the electric current may be cut off gently.

The control circuit 10 discharges the gate G1 at a higher rate in the period from the point in time t1 through the point in time t2 (hereinafter referred to as a "first period") than in the period from the point in time t2 through the point in time t3 (hereinafter referred to as a "second period"). In other words, the control circuit 10 discharges the gate G1 at a lower rate in the second period than in the first period. This allows the switch device 100 to turn OFF in a shorter time by shortening the period between the point in time t1 and the point in time t2 and to decrease the absolute value of the current variation rate of the source current Is between the points in time t2 and t3, thus enabling reducing the surge voltage applied to the switching element 1.

As can be seen from the foregoing description, in the control circuit 10, as the source current Is flowing through the source S1 when the switching element 1 turns OFF decreases, electromotive force is generated in the inductor L1 and an electric current flows in accordance with the electromotive force through the circuit element 5 (capacitor C1) and the resistor R1. This causes an increase in potential at the reference potential point P0 included in the path between the node N3, to which the circuit element 5 is connected, and the gate G1 of the switching element 1. Consequently, in the control circuit 10, the potential difference between the potential at the gate G1 of the switching element 1 and the potential at the reference potential point P0 determines the magnitude of the discharge current Idis flowing from the gate G1.

The control circuit 10 may control the switching element 1 using the inductor L1, the resistor R1, and the capacitor C1. While a current is flowing through the closed-loop circuit including the inductor L1, the capacitor C1, and the resistor R1 with the electromotive force of the inductor L1, the reference potential Vstd at the reference potential point P0 becomes higher than the source potential, thus decreasing the potential difference between the potential at the gate G1 and the reference potential Vstd and thereby decreasing the discharge current Idis flowing from the gate G1. This allows the control circuit 10 to change the current variation rate of the source current Is (in other words, the rate at which the source current Is is cut off) during the second period by changing at least one of the capacitance of the capacitor C1, the resistance value of the resistor R1, or the inductance of the inductor L1. For example, if the capacitance of the capacitor C1 of the control circuit 10 is changed, then the characteristics are the same during the first period but the current variation rates during the second period are different from each other. FIG. 3 shows the waveforms of the source current Is that were obtained when the capacitance of the capacitor C1 was changed into various values in the control circuit 10. In FIG. 3, the characteristics during the second period are indicated by four different types of curves. In the example shown in FIG. 3, the capacitance of the capacitor C1 increases in the order of the characteristics B1, B2, B3, and B4. It can be seen from FIG. 3 that as the capacitance of the capacitor C1 increases, the cutoff rate of the source current Is slows down. In the control circuit 10, even if not the capacitance of the capacitor C1 but the resistance value of the resistor R1 or the inductance of the inductor L1 is increased, the cutoff rate of the source current Is also slows down. Specifically, in the control circuit 10, as the resistance value of the resistor R1 is increased, the switching rate decreases when the switching element 1 turns OFF. That is to say, in the control circuit 10, the absolute value of the current variation rate (di/dt) of the source current Is flowing through the switching element 1 decreases. Also, in the control circuit 10, as the inductance of the inductor L1 is increased, the size of the inductor L1 increases and the size of the control circuit 10 also increases. Thus, to reduce the chances of causing a decrease in the switching rate when the switching element 1 turns ON and to reduce an increase in the size of the control circuit 10, it is advantageous for the control circuit 10 to determine the switching rate when the switching element 1 turns OFF by the capacitance of the capacitor C1. Note that in the control circuit 10, the inductor L1 may have an inductance of 50 nH, the resistor R1 may have a resistance value of 1 Ω, and the capacitor C1 may have a capacitance of 100 nF, for example. However, these numerical values are only examples and should not be construed as limiting. Furthermore, the gate resistor included in the drive circuit 2 may have a resistance value of 50 Ω, which is only an example and should not be construed as limiting, either.

In a comparative example in which the control circuit 10 includes no circuit element 5, not only the discharge current Idis that flows during the period from the point in time t2 through the point in time t3 but also the absolute value of the current variation rate during the period from the point in time t2 through the point in time t3 may be increased when the switching element 1 turns OFF, compared to the control circuit 10 including the circuit element 5. Thus, the comparative example enables shortening the switching time and cutting down the switching loss. According to the comparative example, however, a surge voltage may be generated in the switching element 1 to cause a failure in the switching element 1. In addition, according to the comparative example, decreasing the discharge current Idis during the period from the point in time t2 through the point in time t3 may reduce the chances of generating the surge voltage but may also extend the switching time and cause an increase in switching loss. In contrast, in the switch device 100 including the control circuit 10 according to this embodiment, the discharge current Idis flows from the gate G1 of the switching element 1 in accordance with the potential difference between the gate potential and the reference potential Vstd. In the period from the point in time t2 through the point in time t3, the electric current flowing through the closed-loop circuit including the inductor L1, the circuit element 5, and the resistor R1 decreases the potential difference between the gate potential and the reference potential Vstd, thus decreasing the discharge current Idis and the absolute value of the current variation rate of the source current Is. Thus, the control circuit 10 according to this embodiment allows different amounts of discharge current Idis to flow in the first period from the point in time t1 through the point in time t2 and in the second period from the point in time t2 through the point in time t3 when the switching element 1 turns OFF, thus enabling cutting down the switching loss by increasing the discharge current to flow in the first period and reducing the surge voltage by decreasing the discharge current to flow in the second period. As used herein, the switching loss involved when the switching element 1 turns OFF refers to the power loss caused by the switching element 1 when the switching element 1 implemented as, for example, a semiconductor switch turns OFF.

In addition, in the switch device 100, the amount of the electric current flowing through the resistor R1 of the control circuit 10 increases when the switching element 1 turns ON. This causes the reference potential Vstd to increase and also causes the potential at the gate G1 to rise more gently.

(4) Advantages

A control circuit 10 according to the first embodiment controls a switching element including a gate G1 and a source S1 corresponding to the gate G1. The control circuit 10 includes an inductor L1, a capacitor C1 as a circuit element 5, and a resistor R1. The inductor L1 is connected between the gate G1 and the source S1 of the switching element 1. The circuit element 5 is connected in series to the inductor L1 between the gate G1 and the source S1. The circuit element 5 allows an electric current to flow therethrough in response to generation of electromotive force in the inductor L1.

The control circuit 10 according to the first embodiment may reduce a surge voltage applied to the switching element 1 while cutting down the switching loss involved when the switching element 1 turns OFF.

In addition, the switch device 100 according to the first embodiment includes the switching element 1 and the control circuit 10, and therefore, may also reduce a surge voltage applied to the switching element 1 while cutting down the switching loss involved when the switching element 1 turns OFF.

Variations of First Embodiment

Next, variations of the control circuit 10 and switch device 100 according to the first embodiment will be enumerated one after another. Note that the variations to be described below may be adopted as appropriate in combination with the control circuit 10 and switch device 100 according to the first embodiment. In the following description, any constituent element having the same function as a counterpart of the control circuit 10 and switch device 100 according to the first embodiment described above will be designated by the same reference numeral as that counterpart's, and description thereof will be omitted herein.

First Variation of First Embodiment

Figure 4:
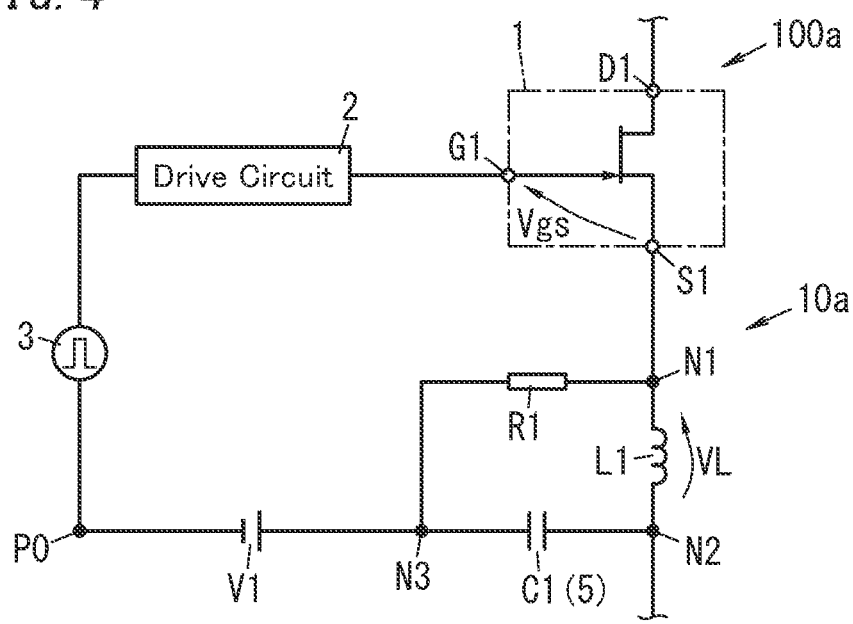
FIG. 4 is a circuit diagram of a switch device including a control circuit according to a first variation of the first embodiment.

Next, a control circuit 10a according to a first variation of the first embodiment and a switch device 100a including the control circuit 10a will be described with reference to FIG. 4.

The control circuit 10a includes a negative power supply V1, which is a difference from the control circuit 10 according to the first embodiment. In this variation, the negative power supply V1 is connected between the node N3 and the low-potential output terminal of the driver 3 (hereinafter referred to as a "negative-side terminal"). In the switch device 100a, the negative-side terminal of the negative power supply V1 is connected to the negative-side terminal of the driver 3. In the other respects, the control circuit 10a has the same configuration as the control circuit 10 (see FIG. 1) according to the first embodiment.

Second Variation of First Embodiment

Figure 5:
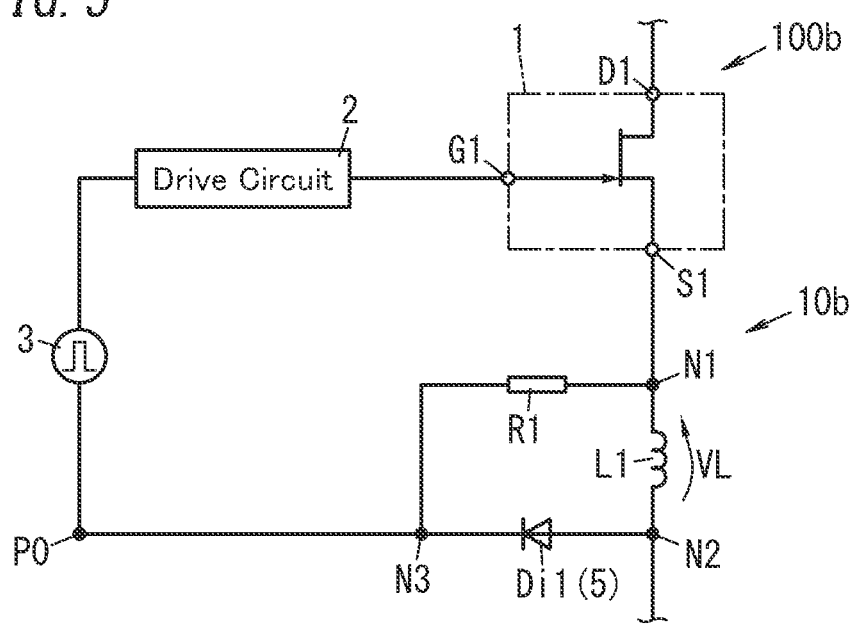
FIG. 5 is a circuit diagram of a switch device including a control circuit according to a second variation of the first embodiment.

Next, a control circuit 10b according to a second variation of the first embodiment and a switch device 100b including the control circuit 10b will be described with reference to FIG. 5.

In the control circuit 10b according to the second variation, the circuit element 5 is a diode Di1, which is a difference from the control circuit 10 according to the first embodiment. The diode Di1 has an anode and a cathode. The anode of the diode Di1 is connected to the node N2. The cathode of the diode Di1 is connected to the node N3. That is to say, in the control circuit 10b, the resistor R1 is connected between the first terminal of the inductor L1 and the cathode of the diode Di1.

Figure 6:
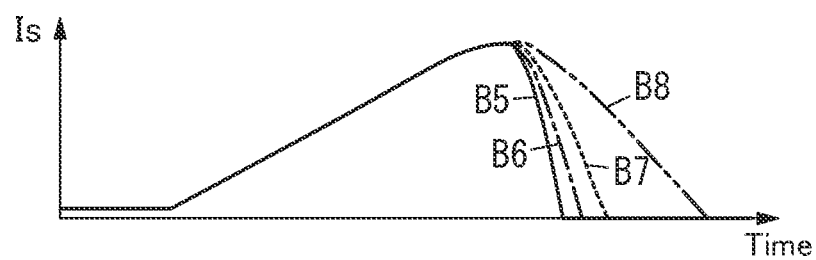
FIG. 6 is a graph illustrating how a source current flowing through a switching element of the switch device changes with time as its parameter is varied.

The circuit operation of this control circuit 10b in which the capacitor C1 of the control circuit 10 is replaced with the diode Di1 is the same as the circuit operation of the control circuit 10. In the control circuit 10b, the electromotive force (counter electromotive force) generated by the inductor L1 is consumed by the diode Di1 and the resistor R1 in the closed-loop circuit including the inductor L1, the diode Di1, and the resistor R1. In this control circuit 10b, the cutoff rate of the source current Is when the switching element 1 turns OFF may be slowed down by increasing the inductance of the inductor L1, for example. FIG. 6 shows the waveforms of the source current Is that were obtained when the inductance of the inductor L1 was changed into various values in the control circuit 10b. In FIG. 6, the characteristics during the second period in which the source current Is decreases are indicated by four different types of curves. In the example shown in FIG. 6, the inductance of the inductor L1 increases in the order of the characteristics B5, B6, B7, and B8. It can be seen from FIG. 6 that as the inductance of the inductor L1 increases, the cutoff rate of the source current Is slows down.

Also, in this control circuit 10b, as the resistance value of the resistor R1 is increased, the time constant of the series circuit of the resistor R1 and the inductor L1 decreases. Thus, increasing the resistance value of the resistor R1 is one of means for increasing the cutoff rate of the source current Is when the switching element 1 turns OFF. Meanwhile, in this control circuit 10b, increasing the resistance value of the resistor R1 means that the resistance value of the resistor R1, located on the path, through which the discharge current Idis from the gate G1 of the switching element 1 flows via the drive circuit 2, increases. Thus, increasing the resistance value of the resistor R1 is also one of means for decreasing the current cutoff rate of the source current Is when the switching element 1 turns OFF. In this control circuit 10, the relation between the resistance value of the resistor R1 and the cutoff rate of the source current Is depends on the combination of other circuit parameters. Thus, it is easier for the control circuit 10b to adjust the cutoff rate of the source current Is with the inductance of the inductor L1 rather than adjusting the cutoff rate of the source current Is with the resistance value of the resistor R1.

Also, in the switch device 100 including the control circuit 10 according to the first embodiment, after the source current Is of the switching element 1 has been cut off, an electric current may flow, as a flow of the electric charge stored in, and drained from, the capacitor C1 to make the gate-source voltage Vgs of the switching element 1 negative in some cases (i.e., make the potential at the source S1 higher than the potential at the gate G1). On the other hand, the switch device 100b including the control circuit 10b according to this variation includes, as the circuit element 5, the diode Di1 instead of the capacitor C1, and therefore, the discharge current flowing from the circuit element 5 decreases after the source current Is has been cut off. Thus, even if the gate-source voltage Vgs of the switching element 1 becomes negative, the absolute value thereof may still be decreased.

Optionally, the control circuit 10 according to the first embodiment may be combined with the control circuit 10b according to this variation. Specifically, a control circuit that adopts such a combination has a configuration in which the capacitor C1 is connected in series to the diode Di1 of the control circuit 10b according to this variation and the resistor R1 is connected in parallel to the inductor L1, the diode Di1, and the capacitor C1, and therefore, has two circuit elements 5 which are connected in series to the inductor L1. If one of the two circuit elements 5 is hereinafter referred to as a "first circuit element" and the other circuit element 5 as a "second circuit element," the first circuit element is the diode Di1 and the second circuit element is the capacitor C1, for example.

Third Variation of First Embodiment

Figure 7:
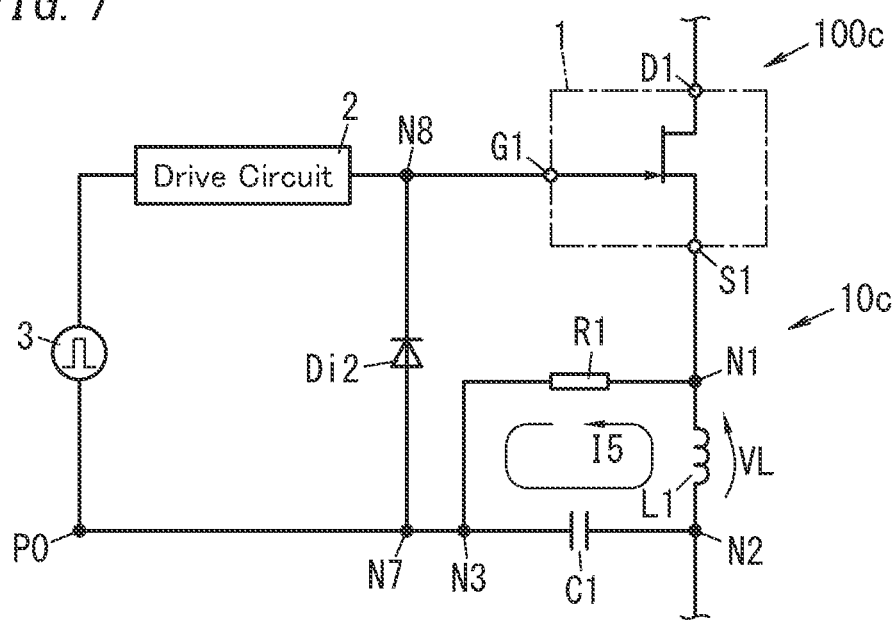
FIG. 7 is a circuit diagram of a switch device including a control circuit according to a third variation of the first embodiment.

Next, a control circuit 10c according to a third variation of the first embodiment and a switch device 100c including the control circuit 10c will be described with reference to FIG. 7.

In the control circuit 10c according to this variation, a protective diode Di2 is further provided for the control circuit 10 according to the first embodiment, which is a difference from the control circuit 10 according to the first embodiment. The protective diode Di2 includes an anode and a cathode. The protective diode Di2 may be a Schottky diode, for example, but may also be a different type of diode from the Schottky diode.

The protective diode Di2 is connected between the reference potential point P0 and the gate G1 to form a different path from the path that connects the node N3 and the gate G1 together. Specifically, in this control circuit 10c, the anode of the protective diode Di2 is connected to a node N7 located on the path between the negative-side terminal of the driver and the node N3. The protective diode Di2 is connected to a point of connection between the resistor R1 and the circuit element 5. Thus, in the switch device 100c including this control circuit 10c, the anode of the protective diode Di2 is connected to the negative-side terminal of the driver 3, and therefore, comes to have substantially the same potential as the potential at the reference potential point P0. On the other hand, the cathode of the protective diode Di2 is connected to a node N8 located on the path between the drive circuit 2 and the gate G1 of the switching element 1, and therefore, comes to have substantially the same potential as the potential at the gate G1 of the switching element 1.

In the switch device 100c including this control circuit 10c, after the source current Is of the switching element 1 has been cut off, the electric charge stored in the capacitor C1 flows as an electric current I5 through, and is consumed by, a closed-loop circuit including the capacitor C1, the inductor L1, and the resistor R1. When the source current Is has been cut off completely, the potential at the gate G1 of the switching element 1 is approximately equal to the potential at the reference potential point P0. Thus, in the switch device 100c, as the electric current I5 flows, the gate potential becomes lower than the source potential to make the gate-source voltage Vgs negative. In the switch device 100c, when the gate-source voltage Vgs of the switching element 1 becomes negative, the protective diode Di2 operates to make the gate-source voltage Vgs constant. As a result, in the switch device 100c, the gate-source voltage Vgs becomes approximately equal to the conduction voltage of the protective diode Di2. Thus, in the switch device 100c, the switching element 1 is protected.

Optionally, the control circuit 10c may further include another resistor which is connected in series to the protective diode Di2 between the nodes N7 and N8 to prevent the protective diode Di2 from causing dielectric breakdown, for example.

Optionally, the control circuit 10c may further include a negative power supply, of which the positive-side terminal is connected to the node N7, between the node N7 and the negative-side terminal of the driver 3. In that case, the protective diode Di2 is preferably implemented as a series circuit of a plurality of diodes to prevent the protective diode Di2 from being kept electrically conductive with the voltage of the negative power supply. This increases the forward voltage of the protective diode Di2, thus enabling preventing the protective diode Di2 from being kept electrically conductive with the voltage of the negative power supply.

Fourth Variation of First Embodiment

Figure 8:
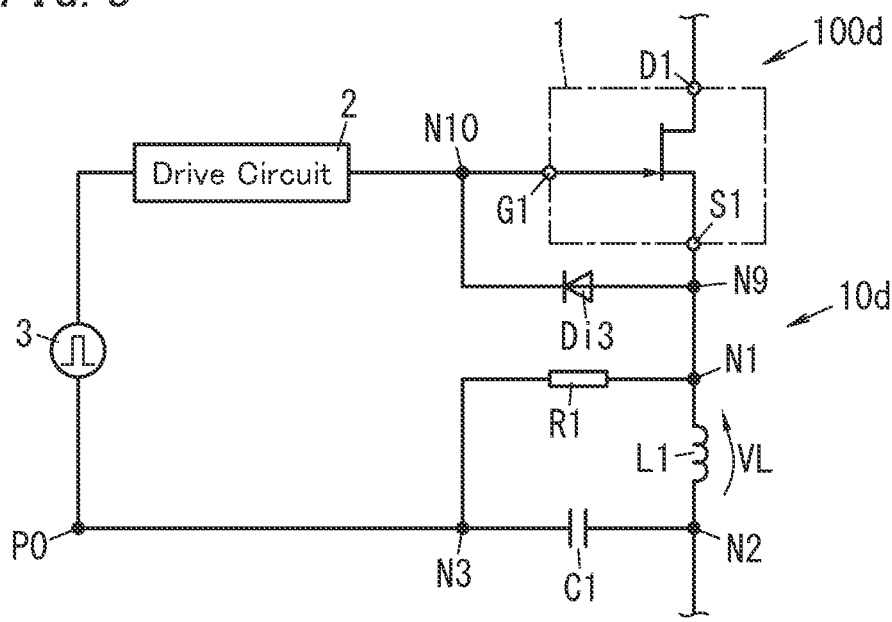
FIG. 8 is a circuit diagram of a switch device including a control circuit according to a fourth variation of the first embodiment.

Next, a control circuit 10d according to a fourth variation of the first embodiment and a switch device 100d including the control circuit 10d will be described with reference to FIG. 8.

The control circuit 10d according to the fourth variation includes a protective diode Di3, which is connected between the gate G1 and source S1 of the switching element 1, which is a difference from the control circuit 10 according to the first embodiment. The protective diode Di3 includes an anode and a cathode. The protective diode Di3 may be a Schottky diode, for example, but may also be a different type of diode from the Schottky diode. In the protective diode Di3, the anode of the protective diode Di3 is connected to the source S1 of the switching element 1 and the cathode of the protective diode Di3 is connected to the gate G1 of the switching element 1. In the switch device 100d including this control circuit 10d, the anode of the protective diode Di3 is connected to a node N9. The node N9 is located on the path between the source S1 of the switching element 1 and a node N1 between the inductor L1 and the resistor R1. The cathode of the protective diode Di3 is connected to a node N10 located on the path between the gate G1 of the switching element 1 and the drive circuit 2.

In the control circuit 10d according to the fourth variation, the protective diode Di3 is connected between the gate G1 and source S1 of the switching element 1. This enables keeping the gate-source voltage Vgs constant (i.e., clamping the gate-source voltage Vgs) with the forward voltage of the protective diode Di3 when the electric charge stored in the capacitor C1 flows as an electric current I5 (see FIG. 7) through the closed-loop circuit including the capacitor C1, the inductor L1, and the resistor R1 after the source current Is of the switching element 1 has been cut off. This allows the control circuit 10d to reduce the chances of the potential at the source S1 of the switching element 1 increasing too much with respect to the potential at the gate G1, thus enabling protecting the switching element 1.

Other Variations of First Embodiment

In the control circuit 10 according to the first embodiment, the resistor R1 is an electronic component (resistor). However, this is only an example and should not be construed as limiting. Alternatively, the resistor R1 may also be implemented as, for example, a cable having electrical conductivity (i.e., an electric wire cable). The resistance value of the resistor R1 may be less than 1 Ω and may be closer to 0 Ω than to 1 Ω.

In the control circuit 10 according to the first embodiment, the inductor L1 is an electronic component (e.g., a surface-mounted inductor). However, this configuration is only an example and should not be construed as limiting. Alternatively, the inductor L1 may also be implemented as, for example, a cable having electrical conductivity (i.e., an electric wire cable). That is to say, the inductor L1 may also be configured to use parasitic inductance.

Second Embodiment

Figure 9:
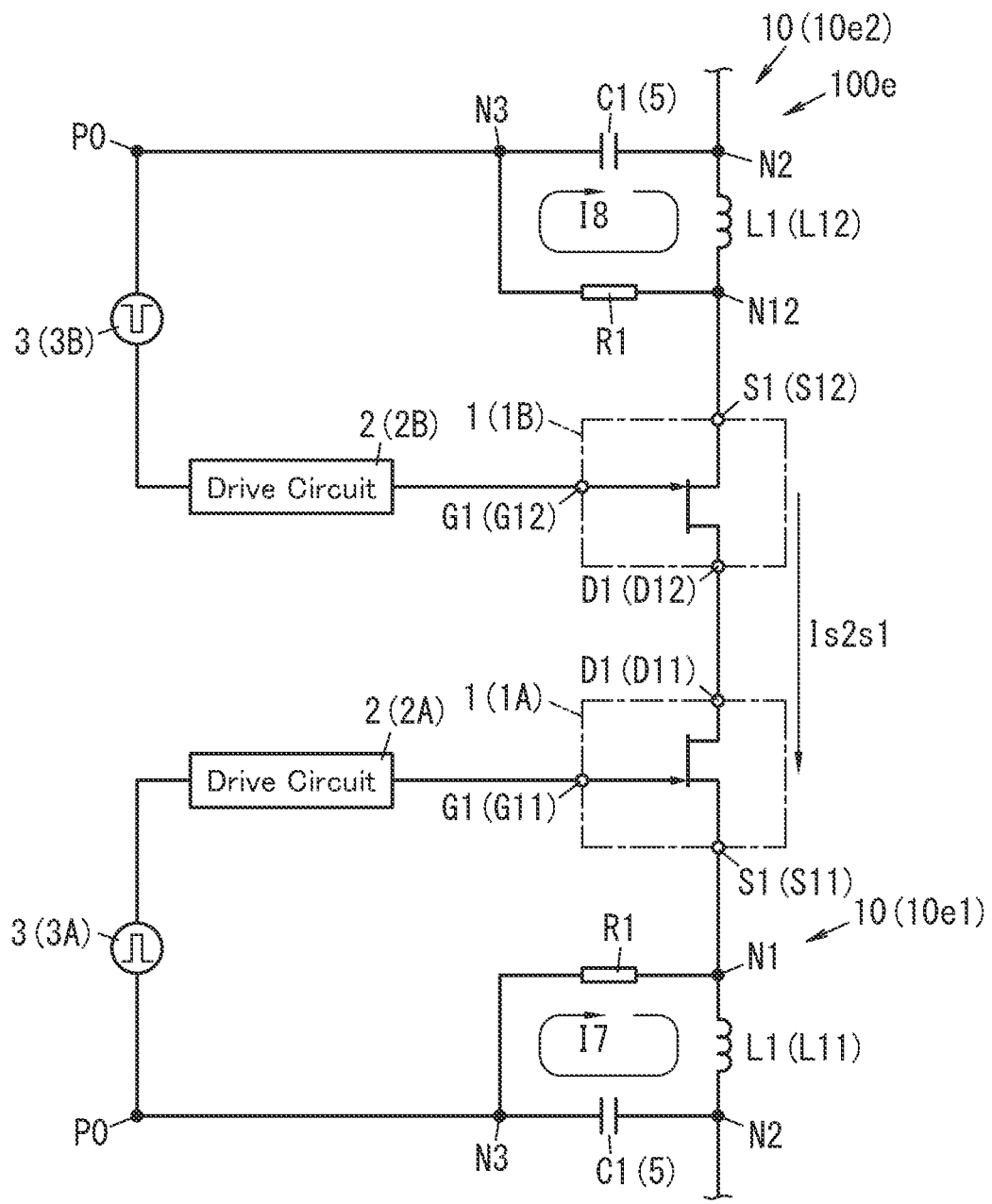
FIG. 9 is a circuit diagram of a switch device according to a second embodiment.

Next, a switch device 100e according to a second embodiment will be described with reference to FIG. 9.

If the configuration of the switch device 100 according to the first embodiment is called a "basic circuit," the switch device 100e according to the second embodiment has two basic circuits and includes a bidirectional switch formed by connecting together the respective switching elements 1 of the two basic circuits, which is a difference from the first embodiment. In the following description, any constituent element of the switch device 100e according to this second embodiment, having the same function as a counterpart of the switch device 100 according to the first embodiment described above, will be designated by the same reference numeral as that counterpart's, and description thereof will be omitted herein.

A bidirectional switch is an important device for replacing a power converter circuit, which has been implemented as an inverter circuit and a converter circuit, with a power converter circuit of a matrix converter type. The power converter circuit of the matrix converter type may convert, for example, AC power into AC power with an arbitrary frequency by turning ON and OFF, at high speeds, bidirectional switches that are arranged in a matrix pattern.

The switch device 100e includes two switching elements 1 and two control circuits 10, which is a difference from the switch device 100 according to the first embodiment. Also, in the switch device 100e, the two switching elements 1 are connected in series and the two control circuits 10 are associated one to one with the two switching elements 1.

Each of the two switching elements 1 includes a source S1, a gate G1, and a drain D1. In this switch device 100e, the respective drains D1 of the two switching elements 1 are connected to each other. In this switch device 100e, a bidirectional switch is formed by these two switching elements 1. In the following description, out of the two switching elements 1, the lower switching element 1 in FIG. 9 will be hereinafter referred to as a "first switching element 1A" and the upper switching element 1 in FIG. 9 will be hereinafter referred to as a "second switching element 1B" for the sake of convenience of description. Also, in the following description, the source S1, gate G1, and drain D1 of the first switching element 1A will be hereinafter referred to as a "first source S11," a "first gate G11," and a "first drain D11," respectively, and the source S1, gate G1, and drain D1 of the second switching element 1B will be hereinafter referred to as a "second source S12," a "second gate G12," and a "second drain D12," respectively. Furthermore, in the following description, out of the two control circuits 10, the control circuit 10 associated with the first switching element 1A will be hereinafter referred to as a "first control circuit 10e1" and the control circuit 10 associated with the second switching element 1B will be hereinafter referred to as a "second control circuit 10e2." Furthermore, in the following description, the inductor L1 of the first control circuit 10e1 will be hereinafter referred to as a "first inductor L11" and the inductor L1 of the second control circuit 10e2 will be hereinafter referred to as a "second inductor L12." Furthermore, in the following description, the driver 3 associated with the first switching element 1A will be hereinafter referred to as a "first driver 3A" and the driver 3 associated with the second switching element 1B will be hereinafter referred to as a "second driver 3B." Furthermore, in the following description, the drive circuit 2 associated with the first switching element 1A will be hereinafter referred to as a "first drive circuit 2A" and the drive circuit 2 associated with the second switching element 1B will be hereinafter referred to as a "second drive circuit 2B." Furthermore, the potential at the reference potential point P0 between the node N3 of the first control circuit 10e1 and the low-potential output terminal of the first driver 3A will be hereinafter referred to as a "first reference potential Vstd1" and the potential at the reference potential point P0 between the node N3 of the second control circuit 10e2 and the low-potential output terminal of the second driver 3B will be hereinafter referred to as a "second reference potential Vstd2." Furthermore, in the bidirectional switch including the two switching elements 1, the electric current flowing from the second source S12 toward the first source S11 will be hereinafter referred to as a "source current Is2$s$1" and the electric current flowing from the first source S11 toward the second source S12 will be hereinafter referred to as a "source current Is1$s$2." In the switch device 100e, a load circuit including a load and a power supply is connected between a first terminal at one end of a series circuit including the first inductor L11, the first switching element 1A, the second switching element 1B, and the second inductor L12 and a second terminal at the other end thereof.

Next, the operation of the switch device 100e will be described at the time of turn OFF when the bidirectional switch is turned OFF from a state where the source current Is2$s$1 is flowing through the bidirectional switch including the two switching elements 1 (i.e., when the two switching elements 1 are in ON state and the bidirectional switch is in ON state). As used herein, "to tun OFF the bidirectional switch" means turning OFF both the first switching element 1A and the second switching element 1B.

In the switch device 100e, when the source current Is1$s$2 that has been increasing starts to decrease after the bidirectional switch has started to be turned OFF, counter electromotive force (induced electromotive force) is generated in each of the first inductor L11 and the second inductor L12. In the switch device 100e, when the counter electromotive force is generated in the first inductor L11, the first reference potential Vstd1 becomes higher than the potential at the first source S11. As a result, in the switch device 100e, the potential difference between the potential at the first gate G11 of the first switching element 1A and the first reference potential Vstd1 decreases, and therefore, the discharge current flowing from the first gate G11 of the first switching element 1A also decreases, thus causing the cutoff rate of the source current Is2$s$1 to slow down.

On the other hand, in the switch device 100e, when the counter electromotive force is generated in the second inductor L12, the second reference potential Vstd2 becomes lower than the source potential of the second switching element 1B. As a result, in the switch device 100e, the potential difference between the second gate G12 of the second switching element 1B and the second reference potential Vstd2 increases, thus turning the second switching element 1B OFF before the first switching element 1A turns OFF. From the viewpoint of cutting off the source current Is2$s$1 flowing through the bidirectional switch, the source current Is2$s$1 flows through the second switching element 1B, no matter whether the second switching element 1B is ON or OFF. Thus, the turn-off rate of the second switching element 1B does not affect cutoff of the principal current (source current Is2$s$1) of the bidirectional switch.

In the first control circuit 10e1 associated with the first switching element 1A, after the source current Is2$s$1 of the bidirectional switch has been cut off, an electric current I7 flows, as a flow of the electric charge that has been stored in, and drained from, the capacitor C1, through a closed-loop circuit including the capacitor C1, the resistor R1, and the first inductor L11. On the other hand, in the second control circuit 10e2 associated with the second switching element 1B, after the source current Is2$s$1 has been cut off, an electric current I8 flows, as a flow of the electric charge that has been stored in, and drained from, the capacitor C1, through a closed-loop circuit including the capacitor C1, the resistor R1, and the second inductor L12.

Next, the operation of the switch device 100e will be described at the time of turn OFF when the bidirectional switch is turned OFF from a state where the source current Is1$s$2 is flowing through the bidirectional switch including the two switching elements 1 (i.e., when the two switching elements 1 are in ON state and the bidirectional switch is in ON state).

In the switch device 100e, when the source current Is2$s$1 that has been increasing starts to decrease after the bidirectional switch has started to be turned OFF, counter electromotive force (induced electromotive force) is generated in each of the first inductor L11 and the second inductor L12. In the switch device 100e, when the counter electromotive force is generated in the first inductor L11, the first reference potential Vstd1 becomes lower than the source potential of the 1 switching element 1A. As a result, the potential difference between the gate potential of the first switching element 1A and the first reference potential increases, and therefore, the first switching element 1A turns OFF before the second switching element 1B turns OFF.

On the other hand, in the switch device 100e, when the counter electromotive force is generated in the second inductor L12, the second reference potential Vstd2 becomes higher than the source potential of the second switching element 1B. As a result, in the switch device 100e, the potential difference between the second gate G12 of the second switching element 1B and the second reference potential Vstd2 decreases, and therefore, the discharge current flowing from the second gate G2 of the second switching element 1B decreases, thus causing the cutoff rate of the source current Is1s2 to slow down.

The switch device 100e according to the second embodiment includes two switching elements 1 and two control circuits 10 associated one to one with the two switching elements 1. This enables reducing a surge voltage applied to each of the two switching elements 1 while cutting down the switching loss involved when each of the switching elements 1 turns OFF.

In addition, the switch device 100e according to the second embodiment also enables reducing a surge voltage applied to the bidirectional switch while cutting down the switching loss involved when the bidirectional switch turns OFF.

Variations of Second Embodiment

Next, variations of the switch device 100e according to the second embodiment will be enumerated one after another. Note that the variations to be described below may be adopted as appropriate in combination with the first and second embodiments described above.

First Variation of Second Embodiment

Figure 10:
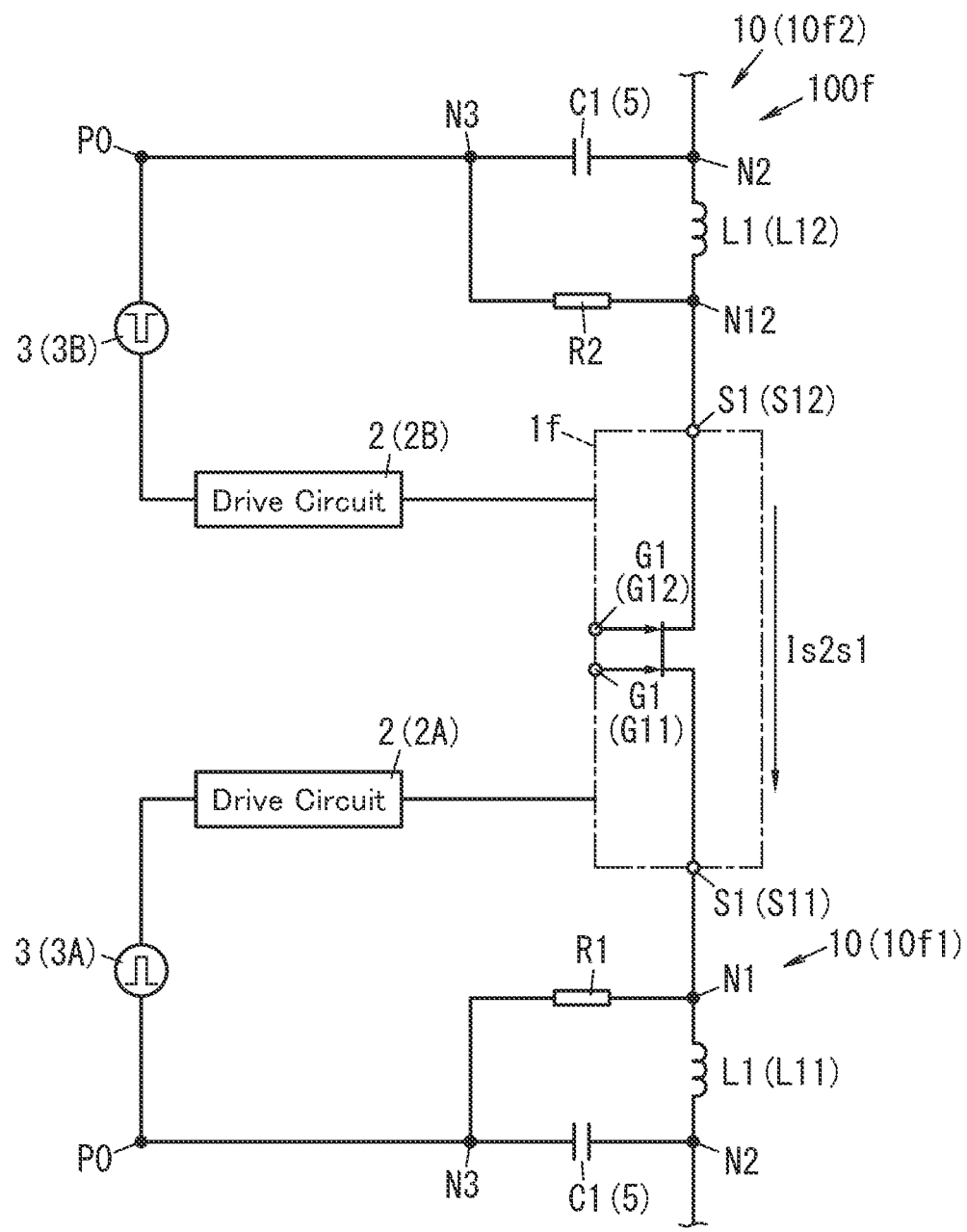
FIG. 10 is a circuit diagram of a switch device according to a first variation of the second embodiment.

Next, a switch device 100f according to a first variation of the second embodiment will be described with reference to FIG. 10.

The switch device 100e according to the second embodiment includes the bidirectional switch formed by connecting together the respective drains D1 of the two switching elements 1 as described above. On the other hand, the switch device 100f according to the first variation of the second embodiment includes a single switching element 1f instead of the two switching elements 1, which is difference from the switch device 100e according to the second embodiment. The switching element 1f is a dual-gate bidirectional switch including two gates G1 and two sources S1.

In the switching element 1f, the two gates G1 and the two sources S1 correspond one to one to each other. In the following description, in the switching element 1f, one of the two gates G1 will be hereinafter referred to as a "first gate G11" and the other gate G1 as a "second gate G12" for the sake of convenience of description. In the same way, out of the two sources S1, the source S1 corresponding to the first gate G11 will be hereinafter referred to as a "first source S11" and the source S1 corresponding to the second gate G12 will be hereinafter referred to as a "second source S12."

In the following description, the switching element 1f will be described briefly first, and then the switch device 100f will be described.

The switching element 1f is a type of GaN-based GIT. The switching element 1f includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The buffer layer is formed on the substrate. The first nitride semiconductor layer is formed on the buffer layer. The second nitride semiconductor layer is formed on the first nitride semiconductor layer. The first source electrode, the first gate electrode, the second gate electrode, and the second source electrode are formed on the second nitride semiconductor layer. The first p-type layer is interposed between the first gate electrode and the second nitride semiconductor layer. The second p-type layer is interposed between the second gate electrode and the second nitride semiconductor layer. In the switching element 1f, the first source S11 includes the first source electrode. The first gate G11 includes the first gate electrode and the first p-type layer. The second gate G12 includes the second gate electrode and the second p-type layer. The second source S12 includes the second source electrode. The substrate is a silicon substrate, for example. The buffer layer is an undoped GaN layer, for example. The first nitride semiconductor layer is, for example, an undoped GaN layer. The second nitride semiconductor layer is, for example, an undoped AlGaN layer. Each of the first p-type layer and the second p-type layer is, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

In the switching element 1f, the second nitride semiconductor layer forms, along with the first nitride semiconductor layer, a heterojunction portion. In the first nitride semiconductor layer, a two-dimensional electron gas has been generated in the vicinity of the heterojunction portion. A region including the two-dimensional electron gas (hereinafter referred to as a "two-dimensional electron gas layer") may also serve as an n-channel layer (electron conduction layer).

In the following description, out of the two control circuits 10, the control circuit 10 connected between the first gate G11 and the second source S11 of the switching element 1f will be hereinafter referred to as a "first control circuit 10/1" and the control circuit 10 connected between the second gate G12 and the second source S12 of the switching element 1f will be hereinafter referred to as a "second control circuit 10/2." Furthermore, in the following description, the inductor L1 of the first control circuit 10/1 will be hereinafter referred to as a "first inductor L11" and the inductor L1 of the second control circuit 10/2 will be hereinafter referred to as a "second inductor L12." Furthermore, in the following description, the driver 3 associated with the first gate G11 of the switching element 1f will be hereinafter referred to as a "first driver 3A" and the driver 3 associated with the second gate G12 of the switching element 1f will be hereinafter referred to as a "second driver 3B." Furthermore, in the following description, the drive circuit 2 associated with the first gate G11 of the switching element 1f will be hereinafter referred to as a "first drive circuit 2A" and the drive circuit 2 associated with the second gate G2 of the switching element 1f will be hereinafter referred to as a "second drive circuit 2B." Furthermore, the potential at the reference potential point P0 between the node N3 of the first control circuit 10f1 and the low-potential output terminal of the first driver 3A will be hereinafter referred to as a "first reference potential Vstd1" and the potential at the reference potential point P0 between the node N3 of the second control circuit 10f2 and the low-potential output terminal of the second driver 3B will be hereinafter referred to as a "second reference potential Vstd2." Furthermore, in the switching element 1f, the electric current flowing from the second source S12 toward the first source S11 will be hereinafter referred to as a "source current Is2s1" and the electric current flowing from the first source S11 toward the second source S12 will be hereinafter referred to as a "source current Is1s2."

Also, in the following description, a state where a voltage equal to or higher than a first threshold voltage (of 1.3 V, for example) is not applied between the first gate G11 and the first source S11 with the first gate G11 having the higher potential will be hereinafter referred to as a "state where the first gate G11 is OFF." Also, a state where a voltage equal to or higher than the first threshold voltage is applied between the first gate G11 and the first source S11 with the first gate G11 having the higher potential will be hereinafter referred to as a "state where the first gate G11 is ON." Furthermore, a state where a voltage equal to or higher than a second threshold voltage (of 1.3 V, for example) is not applied between the second gate G12 and the second source S12 with the second gate G12 having the higher potential will be hereinafter referred to as a "state where the second gate G12 is OFF." Also, a state where a voltage equal to or higher than the second threshold voltage is applied between the second gate G12 and the second source S12 with the second gate G12 having the higher potential will be hereinafter referred to as a "state where the second gate G12 is ON."

This switching element 1f includes the first p-type layer and the second p-type layer, thus implementing a normally OFF transistor.

The switching element 1f may be switched from one of a bidirectionally ON state, a bidirectionally OFF state, a first diode state, or a second diode state to another depending on the combination of a first gate voltage applied to the first gate G11 and a second gate voltage applied to the second gate G12. The first gate voltage is a voltage applied between the first gate G11 and the first source S11. The second gate voltage is a voltage applied between the second gate G12 and the second source S12. The bidirectionally ON state is a state where an electric current is allowed to pass bidirectionally (i.e., in a first direction and a second direction opposite from the first direction). The bidirectionally OFF state is a state where an electric current is blocked bidirectionally. The first diode state is a state where an electric current is allowed to pass in the first direction. The second diode state is a state where an electric current is allowed to pass in the second direction. The electric current in the first direction is the source current Is1s2. The electric current in the second direction is the source current Is2s1.

In a state where the first gate G11 is ON and the second gate G12 is ON, the switching element 1f turns into the bidirectionally ON state. In a state where the first gate G11 is OFF and the second gate G12 is OFF, the switching element 1f turns into the bidirectionally OFF state. In a state where the first gate G11 is OFF and the second gate G12 is ON, the switching element 1f turns into the first diode state.

In a state where the first gate G11 is ON and the second gate G12 is OFF, the switching element 1f turns into the second diode state.

In the switch device 100f, a load circuit including a load and a power supply is connected between a first terminal at one end of a series circuit including the first inductor L11, the switching element 1f, and the second inductor L12 and a second terminal at the other end thereof. Next, the operation of the switch device 100f will be described at the time of turn OFF when the switching element 1f is turned OFF from a state where the switching element 1f is in ON state and the source current Is2s1 is flowing. The first control circuit 10f1 and the second control circuit 10f2 operate in the same way as the first control circuit 10e1 and the second control circuit 10e2, respectively.

In the switch device 100f, when the source current Is1s2 that has been increasing starts to decrease after the switching element 1f has started to be turned OFF, counter electromotive force (induced electromotive force) is generated in each of the first inductor L11 and the second inductor L12.

In the switch device 100f, when the counter electromotive force is generated in the first inductor L11, the first reference potential Vstd1 becomes higher than the potential at the first source 11. As a result, in the switch device 100f, the potential difference between the potential at the first gate G11 of the switching element 1f and the first reference potential Vstd1 decreases, and therefore, the discharge current flowing from the first gate G11 also decreases, thus causing the cutoff rate of the source current Is2s1 to slow down.

On the other hand, in the switch device 100f, when the counter electromotive force is generated in the second inductor L12, the second reference potential Vstd2 becomes lower than the potential at the second source S12. As a result, in the switch device 100f, the potential difference between the potential at the second gate G12 and the reference potential Vstd2 increases, thus turning the second gate G12 OFF.

In the switch device 100f, even if the second gate G12 has turned OFF, the source current Is2s1 continues to flow as long as the first gate G11 is in ON state. Once the first gate G11 has turned OFF, the source current Is2s1 is cut off.

Next, the operation of the switch device 100f will be described at the time of turn OFF when the switching element 1f is turned OFF from a state where the source current Is1s2 is flowing through the switching element 1f.

In the switch device 100f, when the source current Is1s2 that has been increasing starts to decrease after the bidirectional switch has started to be turned OFF, counter electromotive force (induced electromotive force) is generated in each of the first inductor L11 and the second inductor L12.

In the switch device 100f, when the counter electromotive force is generated in the second inductor L12, the second reference potential Vstd2 becomes higher than the potential at the second source S12. As a result, in the switch device 100f, the potential difference between the potential at the second gate G12 and the second reference potential Vstd2 decreases, and therefore, the discharge current flowing from the second gate G12 also decreases, thus causing the cutoff rate of the source current Is1s2 to slow down.

On the other hand, in the switch device 100f, when the counter electromotive force is generated in the first inductor L11, the first reference potential Vstd1 becomes lower than the potential at the first source S11. As a result, in the switch device 100f, the potential difference between the potential at the first gate G11 and the first reference potential Vstd1 increases, thus turning the first gate G11 OFF.

In the switch device 100f, even if the first gate G11 has turned OFF, the source current Is1s2 continues to flow as long as the second gate G12 is in ON state. Once the second gate G12 has turned OFF, the source current Is1s2 is cut off.

As can be seen from the foregoing description, the switch device 100f may slow down the cutoff rate with respect to each of the bidirectional source currents Is2s1, Is1s2, thus reducing the surge voltage applied to the switching element 1f.

Thus, the switch device 100f according to the first variation of the second embodiment may reduce a surge voltage applied to the switching element 1f while cutting down the switching loss involved when the switching element 1f turns OFF.

Second Variation of Second Embodiment

Figure 11:
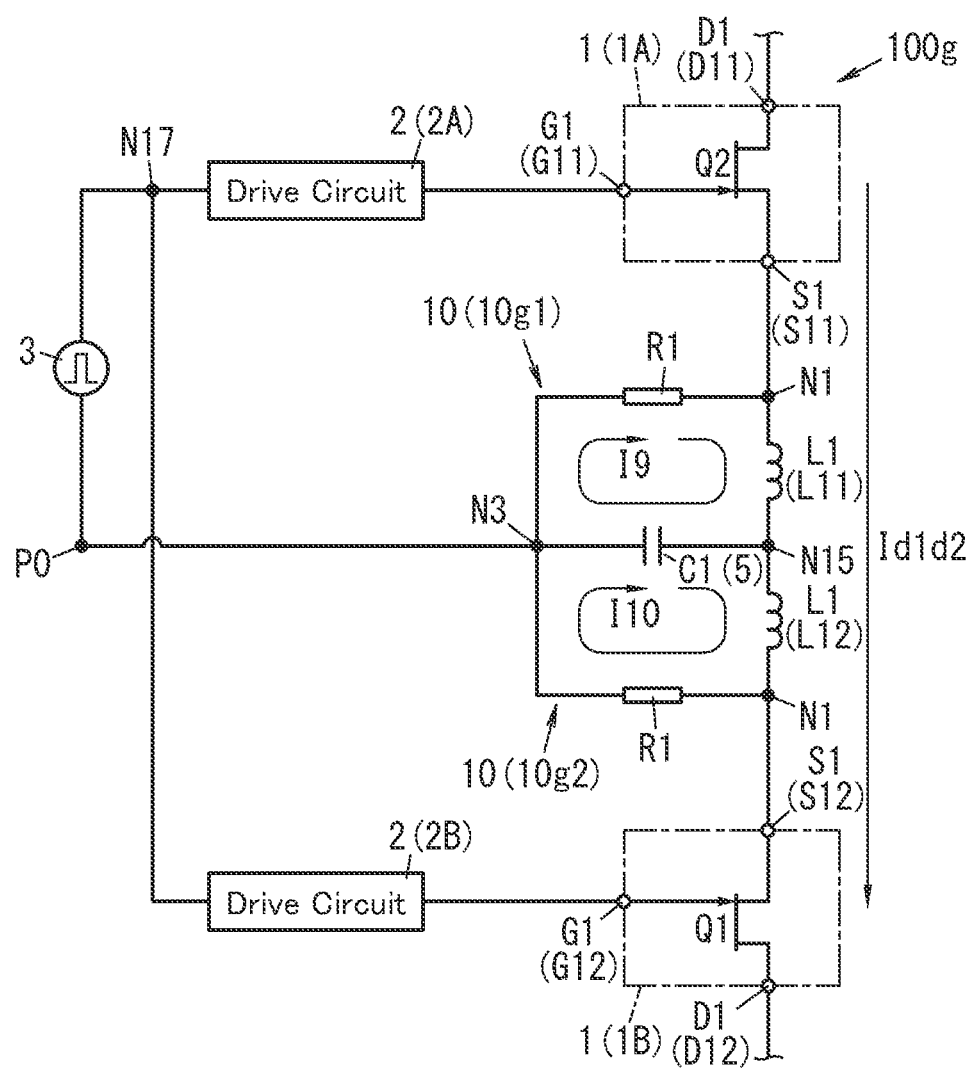
FIG. 11 is a circuit diagram of a switch device according to a second variation of the second embodiment.

Next, a switch device 100g according to a second variation of the second embodiment will be described with reference to FIG. 11.

The switch device 100e according to the second embodiment includes the bidirectional switch formed by connecting together the respective drains D1 of the two switching elements 1. On the other hand, in the switch device 100g according to the second variation, the respective sources S1 of the two switching elements 1 are connected together, which is a difference from the switch device 100e according to the second embodiment.

In the following description, out of the two switching elements 1, the upper switching element 1 in FIG. 11 will be hereinafter referred to as a "first switching element 1A" and the lower switching element 1 in FIG. 11 will be hereinafter referred to as a "second switching element 1B" for the sake of convenience of description. Also, in the following description, the source S1, gate G1, and drain D1 of the first switching element 1A will be hereinafter referred to as a "first source S11," a "first gate G11," and a "first drain D11," respectively, and the source S1, gate G1, and drain D1 of the second switching element 1B will be hereinafter referred to as a "second source S12," a "second gate G12," and a "second drain D12," respectively. Furthermore, in the following description, out of the two control circuits 10, the control circuit 10 associated with the first switching element 1A will be hereinafter referred to as a "first control circuit 10g1" and the control circuit 10 associated with the second switching element 1B will be hereinafter referred to as a "second control circuit 10g2." Furthermore, in the following description, the inductor L1 of the first control circuit 10g1 will be hereinafter referred to as a "first inductor L11" and the inductor L1 of the second control circuit 10g2 will be hereinafter referred to as a "second inductor L12." Furthermore, in the following description, the drive circuit 2 associated with the first switching element 1A will be hereinafter referred to as a "first drive circuit 2A" and the drive circuit 2 associated with the second switching element 1B will be hereinafter referred to as a "second drive circuit 2B." Furthermore, in the bidirectional switch including the two switching elements 1, the electric current flowing from the first drain D11 toward the second drain D12 will be hereinafter referred to as a "drain current Id1d2" and the electric current flowing from the second drain D12 toward the first drain D11 will be hereinafter referred to as a "drain current Id2d1."

In the switch device 100g, the first control circuit 10g1 and the second control circuit 10g2 share the capacitor C1 as the circuit element 5 and the first inductor L1 and the second inductor L2 are connected in series. In the switch device 100g, the first terminal of the first inductor L11 is connected to the first source S11 of the first switching element 1A, the first terminal of the second inductor L12 is connected to the second source S12 of the second switching element 1B, and the second terminal of the first inductor L11 and the second terminal of the second inductor L12 are connected to each other. In the switch device 100g, the capacitor C1 is connected between a node N15 on the path between the second terminal of the first inductor L11 and the second terminal of the second inductor L12 and a node N3. The first drive circuit 2A is connected between the high-potential output terminal of the driver 3 and the first gate G11 of the first switching element 1A. The second drive circuit 2B is connected between the high-potential output terminal of the driver 3 and the second gate G12 of the second switching element 1B. In this variation, the second drive circuit 2B is connected between a node N17, located on a path between the high-potential terminal of the driver 3 and the first drive circuit 2A, and the second gate G12 of the second switching element 1B. In the following description, the low-potential output terminal (negative-side terminal) of the driver 3 will be hereinafter referred to as the reference potential point P0 and the potential at the reference potential point P0 will be hereinafter referred to as a "reference potential Vstd" for the sake of convenience of description.

Next, the operation of the switch device 100g will be described at the time of turn OFF when the bidirectional switch is turned OFF from a state where the drain current Id1d2 is flowing through the bidirectional switch including the two switching elements 1 (i.e., when the two switching elements 1 are in ON state). As used herein, "to tun OFF the bidirectional switch" means turning OFF both the first switching element 1A and the second switching element 1B.

In the switch device 100g, when the drain current Id1d2 that has been increasing starts to decrease after the bidirectional switch has started to be turned OFF, counter electromotive force (induced electromotive force) is generated in each of the first inductor L11 and the second inductor L12. In the switch device 100g, when the counter electromotive force is generated in the first inductor L11, the reference potential Vstd becomes higher than the potential at the first source S11 of the first switching element 1A. As a result, the discharge current flowing from the first gate G11 of the first switching element 1A decreases, thus causing the cutoff rate of the drain current Id1d2 to slow down and thereby reducing the surge voltage applied to the switching element 1A.

On the other hand, in the switch device 100g, when the counter electromotive force is generated in the second inductor L12, the reference potential Vstd becomes lower than the potential at the second source S12 of the second switching element 1B. As a result, the discharge current flowing from the second gate G12 of the second switching element 1B increases, thus turning the second switching element 1B OFF before the first switching element 1A turns OFF. While the drain current Id1d2 is flowing through the switch device 100g, the second switching element 1B cannot cut off the drain current Id1d2, no matter whether the second switching element 1B is ON or OFF. Thus, the cutoff rate of the drain current Id1d2 is not affected.

In the switch device 100g, after the drain current Id1d2 has been cut off, an electric current I9 flows, as a flow of the electric charge that has been stored in, and drained from, the capacitor C1, through a first closed-loop circuit including the capacitor C1, the resistor R1, and the first inductor L11 in the first control circuit 10g1. In addition, an electric current I10 flows, as a flow of the electric charge that has been stored in, and drained from, the capacitor C1, through a second closed-loop circuit including the capacitor C1, the resistor R1, and the second inductor L12 in the second control circuit 10g2.

Next, the operation of the switch device 100g will be described at the time of turn OFF when the bidirectional switch is turned OFF from a state where the drain current Id2d1 is flowing through the bidirectional switch including the two switching elements 1 (i.e., when the two switching elements 1 are in ON state).

In the switch device 100g, when the drain current Id2d1 that has been increasing starts to decrease after the bidirectional switch has started to be turned OFF, counter electromotive force (induced electromotive force) is generated in each of the first inductor L11 and the second inductor L12. In the switch device 100g, when the counter electromotive force is generated in the second inductor L12, the reference potential Vstd becomes higher than the potential at the second source S12 of the second switching element 1B. As a result, the discharge current flowing from the second gate G12 of the second switching element 1B decreases, thus causing the cutoff rate of the drain current Id2d1 to slow down and thereby reducing the surge voltage.

On the other hand, in the switch device 100g, when the counter electromotive force is generated in the first inductor L11, the reference potential Vstd becomes lower than the potential at the first source S11 of the first switching element 1A. As a result, the discharge current flowing from the first gate G11 of the second switching element 1A increases, thus turning the first switching element 1A OFF before the second switching element 1B turns OFF. While the drain current Id2d1 is flowing through the switch device 100g, the first switching element 1A cannot cut off the drain current Id2d1, no matter whether the first switching element 1A is ON or OFF. Thus, the cutoff rate of the drain current Id2d1 is not affected.

In the switch device 100g, after the drain current Id2d1 has been cut off, an electric current I9 flows, as a flow of the electric charge that has been stored in, and drained from, the capacitor C1, through a first closed-loop circuit including the capacitor C1, the resistor R1, and the first inductor L11 in the first control circuit 10g1. In addition, an electric current I10 also flows, as a flow of the electric charge that has been stored in, and drained from, the capacitor C1, through a second closed-loop circuit including the capacitor C1, the resistor R1, and the second inductor L12 in the second control circuit 10g2.

As can be seen from the foregoing description, even the bidirectional switch device 100g that uses a single source in common may also reduce not only the cutoff rate with respect to currents (Id1d2, Id2d1) flowing bidirectionally but also the surge voltage as well.

Thus, the switch device 100g according to the second variation of the second embodiment would reduce a surge voltage applied to each of the switching elements 1 while cutting down the switching loss involved when each of the switching elements if turns OFF.

Other Variations of Second Embodiment

In the second embodiment and the first and second variations thereof, the circuit element 5 is a capacitor C1. However, this configuration is only an example and should not be construed as limiting. Alternatively, the circuit element 5 may also be a diode Di1 as well as the circuit element 5 of the control circuit 10b (see FIG. 5) according to the first variation of the first embodiment.

Also, in the foregoing description, the two basic circuits have the same configuration. However, this configuration is only an example and should not be construed as limiting. Alternatively, the circuit element 5 of one of the two basic circuits may be the capacitor C1 and the circuit element 5 of the other basic circuit may be the diode Di1. Still alternatively, in the control circuit 10, two circuit elements 5 may be connected in series to the inductor L1 with one circuit element 5 implemented as the capacitor C1 and the other circuit element 5 implemented as the diode Di1.

Optionally, each of the second embodiment and the first and second variations thereof may further include the protective diode Di2 (see FIG. 7) of the control circuit 10c according to the third variation of the first embodiment.

Optionally, each of the second embodiment and the first and second variations thereof may further include the protective diode Di3 of the control circuit 10d according to the fourth variation of the first embodiment.

Third Embodiment

A control circuit 10h according to a third embodiment and a switch device 100h including the control circuit 10h will be described with reference to FIG. 12.

The control circuit 10h according to the third embodiment includes, as the circuit element 5, a resistor R1s instead of the capacitor C1 of the control circuit 10 according to the first embodiment, which is a difference from the control circuit 10 according to the first embodiment. The resistor R1s is connected between the inductor L1 and the low-potential output terminal (negative-side terminal) of the driver 3. In the following description, the resistor R1 will be hereinafter referred to as a "first resistor R1" and the resistor R1s will be hereinafter referred to as a "second resistor Rs1" for the sake of convenience of description.

Next, it will be described how the switch device 100h including this control circuit 10h operates.

In the switch device 100h, when the source current Is that has been increasing starts to decrease, counter electromotive force (induced electromotive force) is generated in the inductor L1. When the counter electromotive force is generated in the inductor L1, an electric current flows through a closed-loop circuit including the inductor L1, the second resistor R1s (circuit element 5), and the first resistor R1 in the control circuit 10h. Thus, in the switch device 100h, the reference potential Vstd at the reference potential point P0 becomes higher than the potential at the source S1 of the switching element 1. As a result, the potential difference between the potential at the gate G1 of the switching element 1 and the reference potential Vstd decreases, and therefore, the discharge current Idis flowing from the gate G1 of the switching element 1 also decreases, thus enabling cutting off the electric current gently (i.e., causing the cutoff rate of the source current Is to slow down).

If the capacitor C1 is adopted as the circuit element 5 as in the control circuit 10 according to the first embodiment, then the capacitor C1 is charged, thus causing the reference potential Vstd to change significantly. On the other hand, if the second resistor R1s is adopted as the circuit element 5 as in the control circuit 10h according to the third embodiment, the reference potential Vstd changes less significantly than in a situation where the circuit element 5 is the capacitor C1, thus achieving the advantages of making it easier to predict the operation of the control circuit 10h and facilitating the circuit design.

In addition, the switch device 100h including the control circuit 10h according to the third embodiment may adjust the current variation rate of the principal current (source current) of the switching element 1 as the ratio of the resistance value of the first resistor R1 to the resistance value of the second resistor R1s, thus facilitating the design of the current variation rate. Furthermore, the second resistor R1s has almost no capacitive component, thus reducing the chances of a negative bias being applied to the gate G1 of the switching element 1 as the electric charge stored in the capacitive component is drained.

Optionally, the control circuit 10h according to the third embodiment may be implemented in combination with the control circuit 10 according to the first embodiment. That is to say, the control circuit 10h according to the third embodiment may also have a circuit configuration including not only the circuit element 5 (first circuit element) implemented as the first resistor R1s but also a second circuit element implemented as the capacitor C1 connected in series to the first circuit element.

Variation of Third Embodiment

Figure 13:
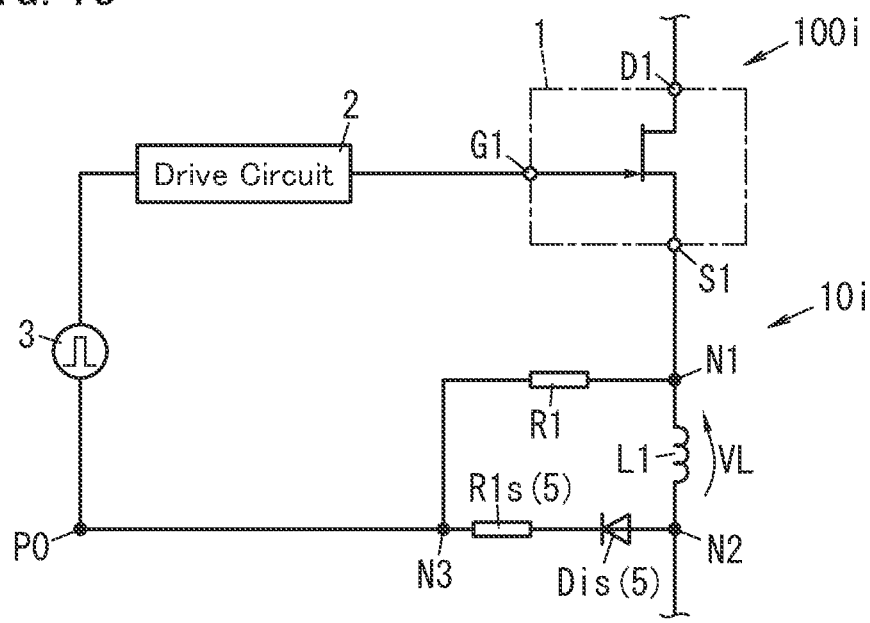
FIG. 13 is a circuit diagram of a switch device including a control circuit according to a variation of the third embodiment.

In the third embodiment described above, the circuit element 5 is implemented as the resistor R1s. However, this configuration is only an example and should not be construed as limiting. Specifically, as shown in FIG. 13, a control circuit 10i according to a variation of the third embodiment includes not only the circuit element 5 implemented as the resistor R1s (first circuit element) but also a circuit element 5 implemented as a diode Dis (second circuit element). In the following description, any constituent element of the control circuit 10i and switch device 100i according to this variation of the third embodiment, having the same function as a counterpart of the control circuit 10h and switch device 100h according to the third embodiment described above, will be designated by the same reference numeral as that counterpart's, and description thereof will be omitted as appropriate herein.

In the control circuit 10i included in the switch device 100i, the resistor R1s and the diode Dis are connected in series. In this variation, the cathode of the diode Dis is connected to the resistor R1s and the anode of the diode Dis is connected to the node N2. Thus, in this control circuit 10i, the resistor R1 is connected in parallel to a series circuit of the resistor R1s (first circuit element) and the diode Dis (second circuit element). In this switch device 100i, as well as in the switch device 100, the high-potential output terminal (positive-side terminal) of the driver 3 is connected to the gate G1 of the switching element 1 via the drive circuit 2.

Next, it will be described how the switch device 100i including the control circuit 10i operates.

In the control circuit 10i, when the source current Is that has been increasing starts to decrease when the switching element 1 turns OFF, electromotive force (counter electromotive force) is generated in the inductor L1. In the control circuit 10i, when the counter electromotive force is generated in the inductor L1, an electric current flows through a closed-loop circuit including the inductor L1, the diode Dis, the second resistor R1s, and the first resistor R1. Thus, in the switch device 100i, the reference potential Vstd at the reference potential point P0 becomes higher than the potential at the source S1. As a result, in the switch device 100i, the potential difference between the potential at the gate G1 of the switching element 1 and the reference potential Vstd decreases, and therefore, the discharge current Idis flowing from the gate G1 of the switching element 1 also decreases, thus enabling cutting off the source current Is of the switching element 1 gently.

In addition, the switch device 100i including the control circuit 10i according to this variation of the third embodiment may adjust the current variation rate of the principal current (source current) of the switching element 1 as the ratio of the resistance value of the first resistor R1 to the resistance value of the second resistor R1s, thus facilitating the design of the current variation rate. Furthermore, the second resistor R1s and the diode Dis have almost no capacitive component, thus reducing the chances of a negative bias being applied to the gate G1 of the switching element 1 as the electric charge stored in the capacitive component is drained.

Optionally, the control circuit 10i according to this variation of the third embodiment may be implemented in combination with the control circuit 10 according to the first embodiment. That is to say, the control circuit 10i may include a plurality of circuit elements 5 that are connected in series to each other between the nodes N2, N3. For example, the control circuit 10i may include a series circuit including the second resistor R1s (first circuit element), the diode Dis (second circuit element), and the capacitor C1 (third circuit element). When electromotive force is generated in the inductor L1, an electric current flows through the first, second, and third circuit elements.

Fourth Embodiment

Figure 14:
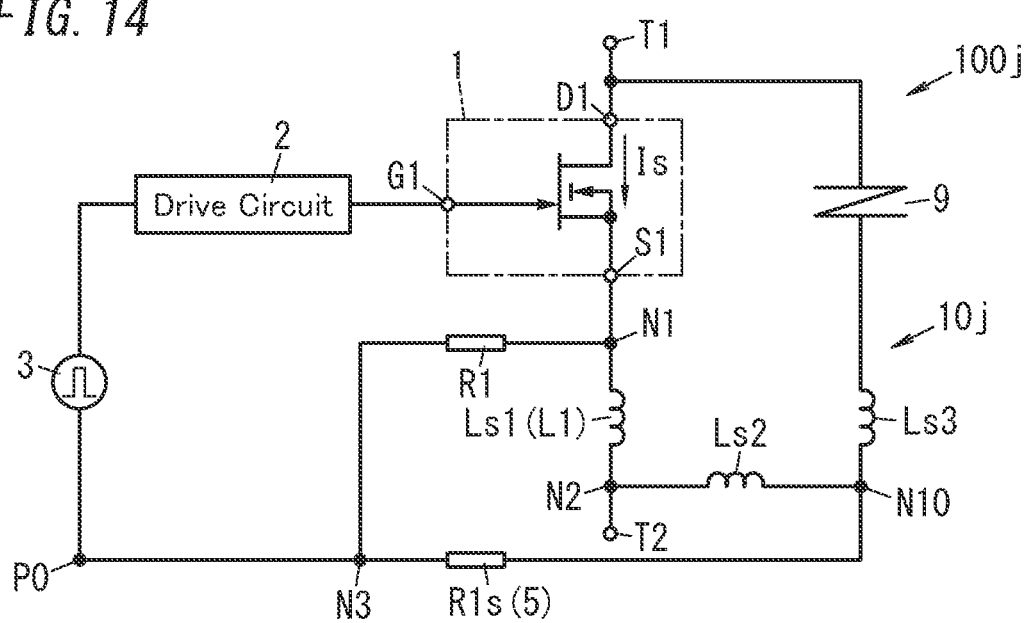
FIG. 14 is a circuit diagram of a switch device including a control circuit according to a fourth embodiment.

A control circuit 10j according to a fourth embodiment and a switch device (switch system) 100j including the control circuit 10j will be described with reference to FIG. 14.

Figure 12:
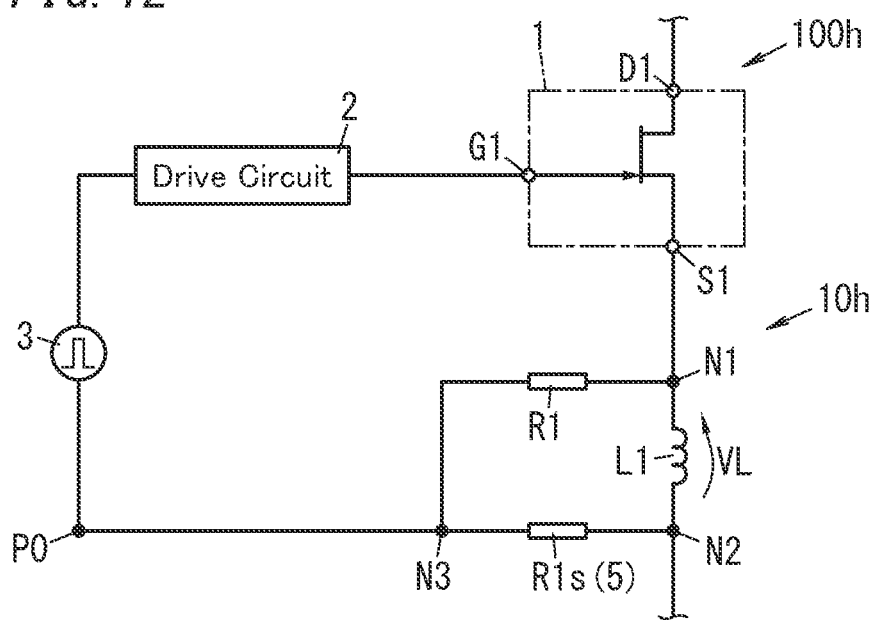
FIG. 12 is a circuit diagram of a switch device including a control circuit according to a third embodiment.

The control circuit 10j according to the fourth embodiment is substantially the same as the control circuit 10h according to the third embodiment (see FIG. 12). The control circuit 10j further includes a voltage clamping element 9, which is connected in parallel to the switching element 1 and the inductor L1 (hereinafter referred to as a "first inductor Ls1"), which is a difference from the control circuit 10h according to the third embodiment. In the following description, any constituent element of the control circuit 10j and switch device 100j according to the fourth embodiment, having the same function as a counterpart of the control circuit 10h and switch device 100h according to the third embodiment described above, will be designated by the same reference numeral as that counterpart's, and description thereof will be omitted herein.

The voltage clamping element 9 has an overvoltage protection function of limiting the surge voltage applied to the switching element 1 when the switching element 1 turns OFF to a predetermined voltage (clamp voltage). That is to say, the voltage clamping element 9 has the function of limiting the voltage between the drain D1 and source S1 of the switching element 1 to a predetermined voltage when the switching element 1 turns OFF. In the example shown in FIG. 14, the voltage clamping element 9 is a varistor. However, this is only an example and should not be construed as limiting. Alternatively, the voltage clamping element 9 may also be a Zener diode (such as a TVS diode). The voltage clamping element 9 has the function of reducing, when a voltage equal to or higher than a certain voltage is applied, the chances of the voltage increasing to a higher voltage. In the meantime, an electric current flows through the voltage clamping element 9.

In addition, the control circuit 10*j* further includes a second inductor Ls2 and a third inductor Ls3. The second inductor Ls2 is connected between the first inductor Ls1 and the second resistor R1*s* as the circuit element 5. The third inductor Ls3 is connected between the voltage clamping element 9 and the path between the second inductor Ls2 and the circuit element 5. Thus, in the switch device 100*j*, a series circuit of the voltage clamping element 9, the third inductor Ls3, and the second inductor Ls2 is connected in parallel to a series circuit of the switching element 1 and the first inductor Ls1. In the control circuit 10*j*, the sum of the inductance of the first inductor Ls1 and the inductance of the second inductor Ls2 is greater than the inductance of the third inductor Ls3.

The switch device 100*j* further includes, for example, a first terminal T1, to which the drain D1 of the switching element 1 is connected, and a second terminal T2, to which a second terminal of the inductor L1 is connected. A first terminal of the inductor L1 is connected to the source S1 of the switching element 1. That is to say, in the switch device 100*j*, a series circuit of the switching element 1 and the first inductor Ls1 is connected between the first terminal T1 and the second terminal T2. Also, in this switch device 100*j*, a load circuit including a load and a power supply, for example, is connected between the first terminal T1 and the second terminal T2, thus connecting the load circuit to the series circuit of the switching element 1 and the first inductor Ls1. Note that the load and the power supply are not constituent elements of the switch device 100*j*.

In the switch device 100*j*, the first terminal T1 and the second terminal T2 are terminals through which a principal current (source current Is) flowing through the switching element 1 flows when the switching element 1 is electrically conductive. One terminal of the second resistor R1*s* of the control circuit 10*j* is connected to a node N10 located on the path between the voltage clamping element 9 and the second terminal T2. The node N10 is located on the path through which the gate current of the switching element 1 flows when the switching element 1 is switched in the switch device 100*j*. The node N10 is also located on the path through which the source current Is does not flow while the switching element 1 is electrically conductive.

Next, it will be described how the switch device 100*j* including the control circuit 10*j* operates.

In the switch device 100*j*, when the source current Is of the switching element 1 that has been increasing starts to decrease when the switching element 1 turns OFF, electromotive force (counter electromotive force) is generated in the first inductor Ls1. At this time, induced electromotive force is also generated in a parasitic inductance such as a wire of the load circuit connected between the first terminal T1 and the second terminal T2. Nevertheless, if the voltage exceeds the clamp voltage of the voltage clamping element 9, a further increase in the voltage is checked by the voltage clamping element 9.

On the other hand, in the switch device 100*j*, when the voltage clamping element 9 is activated, an electric current flows from the first terminal T1 to the second terminal T2 via the third inductor Ls3, the node N10, and the second inductor Ls2. This electric current generates electromotive force in each of the second inductor Ls2 and the third inductor Ls3. Thus, in the control circuit 10*j*, an electric current flows through a closed-loop circuit including the first inductor Ls1, the second inductor Ls2, the second resistor R1*s*, and the first resistor R1. Consequently, in the switch device 100*j*, the reference potential Vstd at the reference potential point P0 becomes higher than the potential at the source S1 of the switching element 1, the potential difference between the potential at the gate G1 of the switching element 1 and the reference potential Vstd decreases, and therefore, the discharge current Idis flowing from the gate G1 of the switching element 1 also decreases, thus enabling cutting off the source current Is gently.

The control circuit 10*j* according to the fourth embodiment includes the first inductor Ls1 and the second inductor Ls2 instead of the inductor L1 of the control circuit 10*h* (see FIG. 12) according to the third embodiment. In the control circuit 10*h*, the induced electromotive force (counter electromotive force), generated in the inductor L1 as the source current Is decreases, increases as the inductance of the inductor L1 increases. From a different point of view, if the inductor L1 has significant inductance, significant electromotive force is generated even if the current variation rate has a small absolute value when the source current Is decreases. Thus, the control circuit 10*j* according to the fourth embodiment achieves the advantage of broadening the operating range of the control circuit 10*j* with respect to the current variation rate of the source current Is. It is sometimes easy for the control circuit 10*j* according to the fourth embodiment to increase the inductance of the second inductor Ls2. In the control circuit 10*j*, while the switching element 1 is ON state (i.e., electrically conductive), an electric current flows continuously through the first inductor Ls1. Thus, if heat generation is a problem, the conductor portion that forms the first inductor Ls1 preferably has its width or diameter increased. On the other hand, the second inductor Ls2 is a portion through which an electric current flows only for a certain period of time when the switching element 1 turns OFF and the voltage clamping element 9 is activated. The second inductor Ls2 rarely causes the problem of heat generation. Thus, the conductor portion that forms the second inductor Ls2 may have its width and/or diameter decreased. Therefore, it is the second inductor Ls2 that its size and cost hardly increase when the inductance is increased. The control circuit 10*j* according to the fourth embodiment achieves the advantage of making it easier to broaden the operating range of the control circuit 10*j* with respect to the current variation rate when the source current Is decreases by increasing the inductance of the second inductor Ls2.

Also, the induced electromotive force generated in the third inductor Ls3 in the control circuit 10*j* is superposed on the clamp voltage of the voltage clamping element 9 and applied to the switching element 1. Thus, to reduce the surge voltage applied to the switching element 1, the ratio of the sum of the respective inductances of the first inductor Ls1 and the second inductor Ls2 to the inductance of the third inductor Ls3 is preferably as large as possible.

The first inductor Ls1, the second inductor Ls2, and the third inductor Ls3 do not have to be electronic components but may each be a conductor pattern (such as a copper pattern) on a board, an electric wire cable, or a lead wire of the voltage clamping element 9, for example.

Fifth Embodiment

Figure 15:
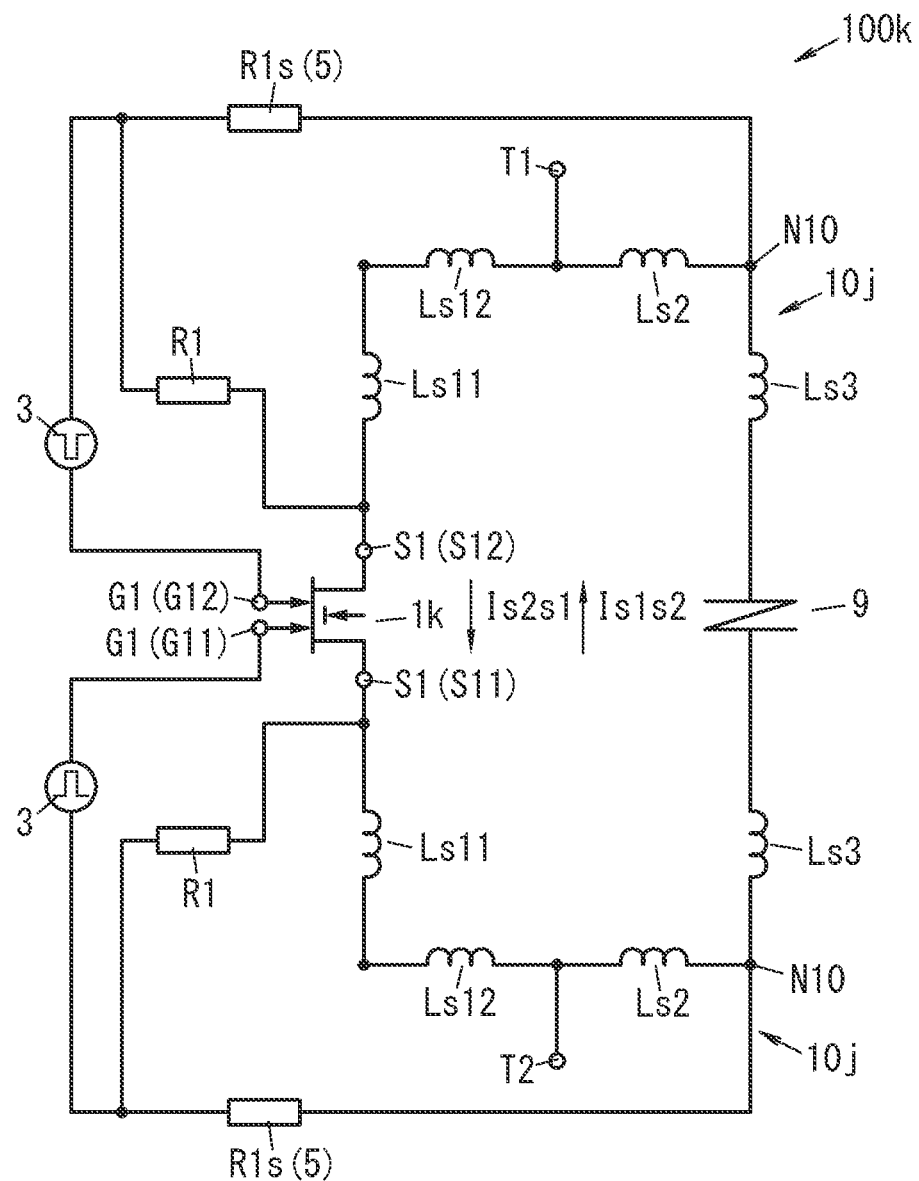
FIG. 15 is a circuit diagram of a switch device including a control circuit according to a fifth embodiment.

A switch device (switch system) 100*k* according to a fifth embodiment will be described with reference to FIG. 15.

The switch device 100*k* according to the fifth embodiment includes a switching element 1*k* instead of the switching element 1 of the switch device 100*j* according to the fourth embodiment and includes two control circuits 10*j*, which is a difference from the switch device 100*j* according to the fourth embodiment. The switching element 1*k* is a dual-gate bidirectional switch including two gates G1 and two sources S1.

In the switching element 1*k*, the two gates G1 and the two sources S1 correspond one to one to each other. In the following description, one of the two gates G1 will be hereinafter referred to as a "first gate G11" and the other gate G1 as a "second gate G12" for the sake of convenience of description. In the same way, out of the two sources S1, the source S1 corresponding to the first gate G11 will be hereinafter referred to as a "first source S11" and the source S1 corresponding to the second gate G12 will be hereinafter referred to as a "second source S12." The switching element 1*k* has the same configuration as the switching element 1*f* (see FIG. 10).

In the switch device 100*k* according to the fifth embodiment, out of the two control circuits 10*j*, one control circuit 10*j* is connected between the first gate G11 and first source S11 of the switching element 1*k* and the other control circuit 10*j* is connected between the second gate G12 and the second source S12 of the switching element 1*k*. Furthermore, in the switch device 100*k*, the voltage clamping element 9 is used in common by the two control circuits 10*j* and the voltage clamping element 9 is connected between the two third inductors Ls3.

The switch device 100*k* according to the fifth embodiment may reduce a surge voltage applied to the switching element 1*k* while cutting down the switching loss involved when the switching element 1*k* turns OFF.

Note that the first to fifth embodiments and their variations described above are only exemplary ones of various embodiments and their variations of the present disclosure and should not be construed as limiting. Rather, the first to fifth exemplary embodiment and their variations may be readily modified in various manners depending on a design choice or any other factor without departing from the scope of the present disclosure.

For example, even though the control circuit 10 includes neither the drive circuit 2 nor the driver 3, the control circuit 10 may include at least one of the drive circuit 2 or the driver 3. Also, in the switch device 100, the driver 3 may include the drive circuit 2.

The first to fifth embodiments and their variations described above may be specific implementations of the following aspects of the present disclosure.

A control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to a first aspect is a control circuit for controlling a switching element (1; 1*f*; 1*k*) including a gate (G1) and a source (S1) corresponding to the gate (G1). The control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) includes an inductor (L1), a circuit element (5), and a resistor (R1). The inductor (L1) is connected between the gate (G1) and the source (S1) of the switching element (1; 1*f*; 1*k*). The circuit element (5) is connected in series to the inductor (L1) between the gate (G1) and the source (S1). The circuit element (5) allows an electric current to flow therethrough in response to generation of electromotive force in the inductor (L1). The resistor (R1) is connected in parallel to the inductor (L1) and the circuit element (5) between the gate (G1) and the source (S1).

This configuration may be expected to reduce a surge voltage applied to a switching element (1; 1*f*; 1*k*) while cutting down the switching loss involved when the switching element (1; 1*f*; 1*k*) turns OFF.

In a control circuit (10; 10*a*) according to a second aspect, which may be implemented in conjunction with the first aspect, the circuit element (5) includes a capacitor (C1).

This configuration enables changing the current variation rate of a principal current (source current Is) flowing through the switching element (1) by changing the circuit constant of the capacitance of the capacitor (C1).

In a control circuit (10*b*) according to a third aspect, which may be implemented in conjunction with the first aspect, the circuit element (5) includes a diode (Di1).

This configuration enables reducing the amount of an electric current discharged from the circuit element (5) after the principal current (source current Is) has been cut off, compared to the control circuit (10; 10*a*) according to the second aspect.

In a control circuit (10*h*) according to a fourth aspect, which may be implemented in conjunction with the first aspect, the circuit element (5) includes a resistor (R1*s*).

This configuration makes it easier to design the current variation rate of a principal current (source current Is) flowing through the switching element (1; 1*f*; 1*k*) compared to the control circuit (10; 10*a*) according to the second aspect and the control circuit (10*b*) according to the third aspect. According to this configuration, the current variation rate is determined by a ratio of the resistance value of the resistor (R1) to the resistance value of the resistor (R1*s*). In addition, in the control circuit (10*h*) according to the fourth aspect, no discharge current flows from the circuit element (5) after the principal current of the switching element (1; 1*f*; 1*k*) has been cut off, thus enabling protecting the switching element (1; 1*f*; 1*k*).

In a control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to a fifth aspect, which may be implemented in conjunction with any one of the first to fourth aspects, when the switching element (1; 1*f*; 1*k*) turns OFF, an electric current flowing through the source (S1) decreases to generate electromotive force in the inductor (L1). As an electric current corresponding to the electromotive force flows through the circuit element (5) and the resistor (R1), a potential at a reference potential point (P0) included in a path between a point of connection where the circuit element (5) and the resistor (R1) are connected together and the gate (G1) increases. A discharge current (Idis) flowing from the gate (G1) is determined by a potential difference between a potential at the gate (G1) and the potential (Vstd) at the reference potential point (P0).

According to this configuration, the current (Idis) flowing from the gate (G1) is determined by the potential difference between the potential at the gate (G1) and the potential (Vstd) at the reference potential point (P0). Thus, the discharge current (Idis) may be limited by causing an increase in the potential (Vstd) at the reference potential point (P0).

A control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to a sixth aspect, which may be implemented in conjunction with any one of the first to fifth aspects, further includes a protective diode (Di2). The protective diode (Di2) includes an anode and a cathode. The anode is connected to a point of connection (node N3) between the circuit element (5) and the resistor (R1). The cathode is connected to the gate (G1) of the switching element (1; 1*f*; 1*k*).

This configuration enables protecting the switching element (1; 1*f*; 1*k*).

A control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to a seventh aspect, which may be implemented in conjunction with any one of the first to fifth aspects, further includes a protective diode (Di3). The protective diode (Di3) includes an anode and a cathode. The anode is connected between the source (S1) of the switching element (1; 1*f*; 1*k*) and a node (N1) located between the inductor (L1) and the resistor (R1). The cathode is connected to the gate (G1) of the switching element (1; 1*f*; 1*k*).

This configuration enables protecting the switching element (1; 1*f*; 1*k*).

A control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to an eighth aspect, which may be implemented in conjunction with any one of the first to seventh aspects, further includes a first terminal (T1), a second terminal (T2), a second inductor (Ls2), a voltage clamping element (9), and a third inductor (Ls3). The first terminal (T1) is connected to the switching element (1; 1*f*; 1*k*) at a point, located opposite from the source (S1), of the switching element (1; 1*f*; 1*k*). The second terminal (T2) is connected to the inductor (L1) at a point, located opposite from the switching element (1; 1*f*; 1*k*), of the inductor (L1). The second inductor (Ls2) is connected between a first node (node N2) and the circuit element (5). The first node (node N2) is located between a first inductor (Ls1) serving as the inductor (L1) and the second terminal (T2). The voltage clamping element (9) is connected in parallel to the switching element (1; 1*f*; 1*k*), the first inductor (Ls1), and the second inductor (Ls2). The third inductor (Ls3) is connected between a second node (node N10) and the voltage clamping element (9). The second node (node N10) is located between the second inductor (Ls2) and the circuit element (5). In this control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*), no electric current flows through the third inductor (Ls3) while the switching element (1; 1*f*; 1*k*) is in ON state.

This configuration enables protecting the switching element (1; 1*f*; 1*k*). In addition, this configuration also makes it easier to set a broad operating range of the control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) with respect to a current variation rate when an electric current (source current Is) flowing through the source (S1) of the switching element (1; 1*f*; 1*k*) decreases.

A switch device (100; 100*a*; 100*b*; 100*c*; 100*d*; 100*e*1; 100*e*2; 100*f*1; 100*f*2; 100*g*1; 100*g*2; 100*h*; 100*i*; 100*j*) according to a ninth aspect includes the control circuit (10; 10*a*; 10*b*; 10*c*; 10*d*; 10*e*1; 10*e*2; 10*f*1; 10*f*2; 10*g*1; 10*g*2; 10*h*; 10*i*; 10*j*) according to any one of the first to eighth aspects and the switching element (1; 1*f*; 1*k*).

This configuration may be expected to reduce a surge voltage applied to a switching element (1; 1*f*; 1*k*) while cutting down the switching loss involved when the switching element (1; 1*f*; 1*k*) turns OFF.

A switch device (100; 100*a*; 100*b*; 100*c*; 100*d*; 100*e*; 100*g*; 100*h*; 100*i*) according to a tenth aspect, which may be implemented in conjunction with the ninth aspect, includes two switching elements (1) and two control circuits (10; 10*a*; 10*b*; 10*c*; 10*d*; 10*h*; 10*i*). In the switch device (100; 100*a*; 100*b*; 100*c*; 100*d*; 100*e*; 100*g*; 100*h*; 100*i*), the two switching elements (1) are connected in series. The two control circuits (10; 10*a*; 10*b*; 10*c*; 10*d*; 10*h*; 10*i*) are associated one to one with the two switching elements (1).

This configuration may be expected to reduce a surge voltage applied to a switching element (1) while cutting down the switching loss involved when the two switching elements (1) turn OFF.

In a switch device (100; 100*a*; 100*b*; 100*c*; 100*d*; 100*e*; 100*f*; 100*g*) according to an eleventh aspect, which may be implemented in conjunction with the tenth aspect, each of the two switching elements (1) includes a drain (D1) cor-responding to the gate (G1). The respective drains (D1) of the two switching elements (1) are connected to each other.

This configuration may be expected to reduce a surge voltage applied to the two switching elements (1) while cutting down the switching loss involved when the two switching elements (1) turn OFF.

In a switch device (100*f*; 100*k*) according to a twelfth aspect, which may be implemented in conjunction with the ninth aspect, the switching element (1*f*; 1*k*) is a dual-gate bidirectional switch including two gates (G1) and two sources (S1). The switch device (100*f*; 100*k*) includes two control circuits (10; 10*j*). One control circuit out of the two control circuits (10; 10*j*) is connected to a gate (G1), associated with the one control circuit, out of the two gates (G1) of the bidirectional switch. The other control circuit out of the two control circuits (10; 10*j*) is connected to a gate (G1), associated with the other control circuit, out of the two gates (G1) of the bidirectional switch.

This configuration may be expected to reduce a surge voltage applied to the switching element (1*f*; 1*k*) while cutting down the switching loss involved when the switching element (1*f*; 1*k*), implemented as a dual-gate bidirectional switch, turns OFF.

In a switch device (100*g*) according to a thirteenth aspect, which may be implemented in conjunction with the tenth aspect, the respective sources (S1, S2) of the two switching elements (1) are connected to each other.

This configuration may be expected to reduce a surge voltage applied to two switching elements (1) while cutting down the switching loss involved when the two switching elements (1) turn OFF.

An object of the present disclosure to be described below is to provide a control circuit and a switch system that may reduce a surge voltage applied to a semiconductor switch while cutting down the switching loss involved when the semiconductor switch turns OFF.

FIRST EXAMPLE

Figure 16:
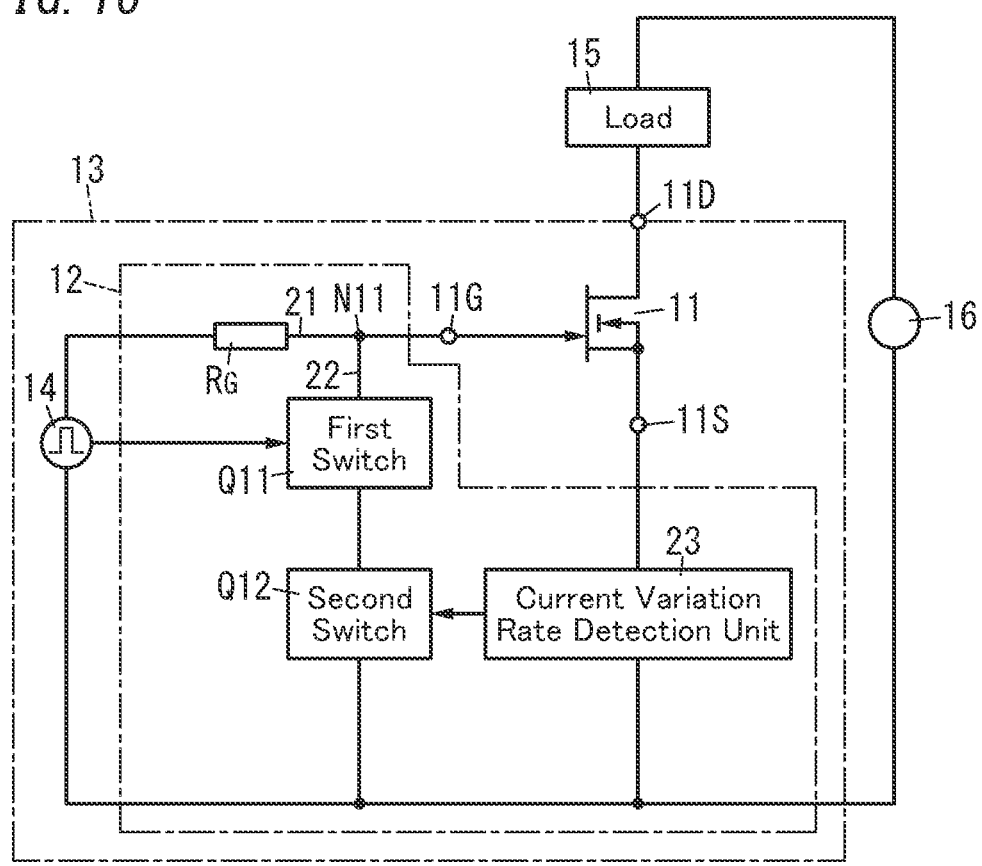
FIG. 16 is a conceptual diagram of a switch system including a control circuit according to a first example.

A control circuit 12 according to a first example and a switch system 13 including the control circuit 12 will be described with reference to FIGS. 16 and 17.

(1) Overview

The control circuit 12 is a control circuit for controlling a semiconductor switch 11. The semiconductor switch 11 includes a gate 11G and a source 11S corresponding to the gate 11G. The semiconductor switch 11 further includes a drain 11D in addition to the gate 11G and the source 11S. The control circuit 12 includes, as discharge paths through which electric charge is drained from the gate 11G of the semiconductor switch 11, a first discharge path 21 and a second discharge path 22, which allows the electric charge to be drained more rapidly than the first discharge path 21. The control circuit 12 includes a first switch Q11 and a second switch Q12 which are provided for the second discharge path 22. The second switch Q12 selectively turns ON according to the current variation rate of a principal current $I_{DS}$ (see FIG. 19) of the semiconductor switch 11. The principal current $I_{DS}$ of the semiconductor switch 11 is an electric current flowing from the drain 11D of the semiconductor switch 11 to the source 11S thereof. The control circuit 12 includes, as a current variation rate detection unit 23 (see FIG. 16) for detecting a current variation rate, an inductor Ls (see FIG. 17) connected to the source 11S of the semiconductor switch 11, for example.

The switch system 13 includes the control circuit 12 and the semiconductor switch 11. Also, in this switch system 13, a series circuit of a load 15 and a power supply 16 is connected between the drain 11D and source 11S of the semiconductor switch 11, for example. In the switch system 13, the series circuit of the load 15 and the power supply 16 is connected to the series circuit of the semiconductor switch 11 and the inductor Ls. Note that the load 15 and the power supply 16 are not counted among the constituent elements of the switch system 13.

(2) Respective Constituent Elements of Switch System (2.1) Semiconductor Switch

The semiconductor switch 11 is, for example, a GaN-based semiconductor switch. More specifically, the semiconductor switch 11 may be a junction field effect transistor (JFET). The JFET serving as the semiconductor switch 11 is, for example, a GaN-based gate injection transistor (GIT).

The semiconductor switch 11 includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. In the semiconductor switch 11, a diode structure is formed by the second nitride semiconductor layer and the p-type layer. The gate 11G of the semiconductor switch 11 includes the gate electrode and the p-type layer. The source 11S of the semiconductor switch 11 includes the source electrode. The drain 11D of the semiconductor switch 11 includes the drain electrode. The substrate is a silicon substrate, for example. The buffer layer is an undoped GaN layer, for example. The first nitride semiconductor layer is, for example, an undoped GaN layer. The second nitride semiconductor layer is, for example, an undoped AlGaN layer. The p-type layer is, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

(2.2) Control Circuit (2.2.1) Configuration of Control Circuit

Figure 17:
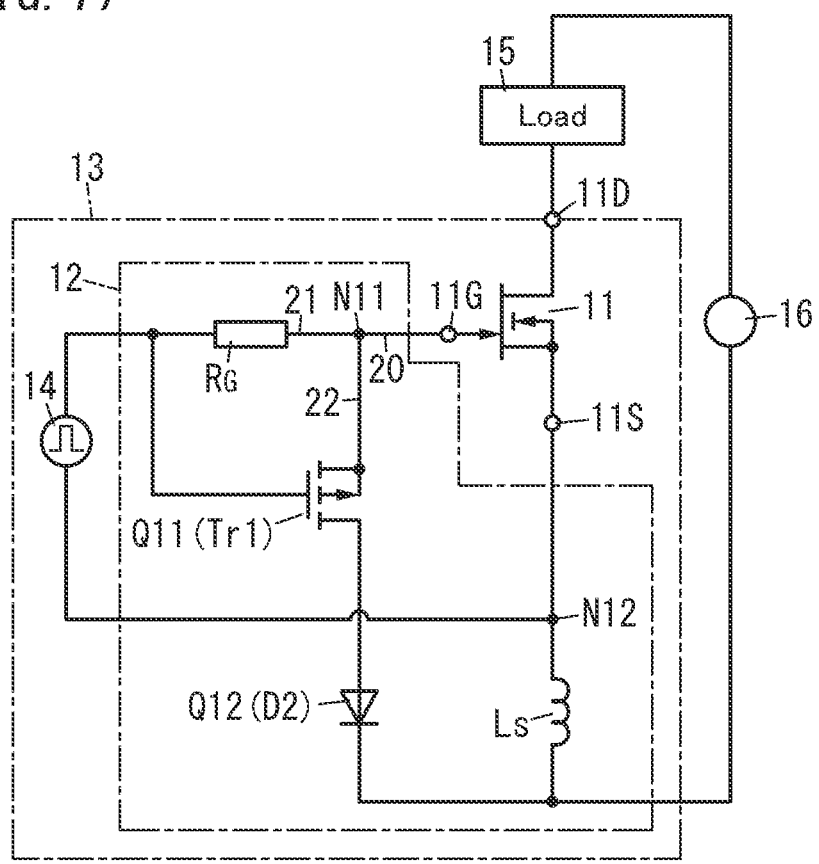
FIG. 17 is a circuit diagram of a switch system including the control circuit.

As shown in FIG. 17, the control circuit 12 according to the first example includes the first discharge path 21, the second discharge path 22, the first switch Q11, and the second switch Q12. The first discharge path 21 is connected to the gate 11G of the semiconductor switch 11. The second discharge path 22 is connected to the gate 11G of the semiconductor switch 11. The second discharge path 22 enables a more rapid discharge than the first discharge path 21. The second switch Q12 may be turned ON and OFF separately from the first switch Q11. The second switch Q12 is provided on the second discharge path 22 and selectively turns ON according to the current variation rate of a principal current of the semiconductor switch 11. In this case, in the control circuit 12 according to the first example, the second switch Q12 turns ON with the electromotive force to be generated in the inductor Ls according to the current variation rate.

(2.2.2) Details of Control Circuit

As shown in FIG. 17, the control circuit 12 includes the first discharge path 21, the second discharge path 22, the first switch Q11, and the second switch Q12.

In this control circuit 12, the first discharge path 21 and the second discharge path 22 include a common discharge path 20 connected to the gate 11G of the semiconductor switch 11. The semiconductor switch 11 is a normally OFF semiconductor switch.

The first discharge path 21 includes a gate resistor $R_G$ connected to the gate 11G of the semiconductor switch 11. The gate resistor $R_G$ is provided for a part, except the common discharge path 20, of the first discharge path 21. The first discharge path 21 is a path for reducing the absolute value of the current variation rate ($-dI_{DS}/dt$) of the principal current $I_{DS}$ when the semiconductor switch 11 turns OFF.

The second discharge path 22 is connected to the gate 11G of the semiconductor switch 11 not via the gate resistor $R_G$. The second discharge path 22 is a path allowing the electric charge stored in the gate 11G of the semiconductor switch 11 to be drained more rapidly than the first discharge path 21.

The first switch Q11 and the second switch Q12 are provided on the second discharge path 22.

The first switch Q11 is connected to a node N11 between the gate resistor $R_G$ and the gate 11G of the semiconductor switch 11. The first switch Q11 is a p-channel field effect transistor Tr1 provided on the second discharge path 22. In this case, the p-channel field effect transistor Tr1 includes a gate, a source, and a drain. In the example illustrated in FIG. 17, the field effect transistor Tr1 is a normally OFF p-channel MOSFET. Meanwhile, the second switch Q12 is a diode D2 provided on the second discharge path 22. The diode D2 includes an anode and a cathode.

In the control circuit 12, the source of the p-channel field effect transistor Tr1 is connected to the gate 11G of the semiconductor switch 11 and the drain of the p-channel field effect transistor Tr1 is connected to the anode of the diode D2. Also, in this control circuit 12, the gate resistor $R_G$ is connected between the gate and source of the p-channel field effect transistor Tr1.

The second discharge path 22 includes an inductor Ls which is connected in series to the diode D2. Thus, on the second discharge path 22, the p-channel field effect transistor Tr1, the diode D2, and the inductor Ls are connected in series. The inductor Ls has a first terminal and a second terminal. On the second discharge path 22, the first terminal of the inductor Ls is connected to the cathode of the diode D2. On the second discharge path 22, the second terminal of the inductor Ls is connected to the source 11S of the semiconductor switch 11. The second switch Q12 is provided on the second discharge path 22 as described above and selectively turns ON according to the current variation rate of the principal current $I_{DS}$ of the semiconductor switch 11. In the control circuit 12 according to the first example, the second switch Q12 turns ON in accordance with the electromotive force generated in the inductor Ls in response to a current variation of the principal current $I_{DS}$.

In this control circuit 12, a driver 14 is connected via the gate resistor $R_G$ between the node N11 and the second terminal of the inductor Ls. The driver 14 is not a constituent element of the control circuit 12 but a constituent element of the switch system 13. The driver 14 has a high-potential output terminal and a low-potential output terminal. In this control circuit 12, the high-potential output terminal of the driver 14 is connected to the gate resistor $R_G$ and the low-potential output terminal of the driver 14 is connected to the second terminal of the inductor Ls. In the switch system 13, the low-potential output terminal of the driver 14 is connected to a node N12 between the source 11S of the semiconductor switch 11 and the second terminal of the inductor Ls. The driver 14 is a driver which may apply not only a positive bias voltage but also a negative bias voltage to between the gate 11G and source 11S of the semiconductor switch 11. The driver 14 is a driver which includes, for example, a DC power supply and a complementary metal-oxide semiconductor (CMOS) inverter and which may change the output voltage within the range from −12 V to 18 V.

(2.2.3) Operation of Control Circuit and Switch System

Next, it will be described with reference to FIGS. 18, 19A, 19B, 20A, 20B, 21A, and 21B how the control circuit 12 and the switch system 13 operate. Note that in FIGS. 18, 19A, 20A, and 21A, a circuit section, through which no electric current flows, is drawn in a different type of line from the other circuit sections to make the former circuit section easily recognizable.

Figure 18:
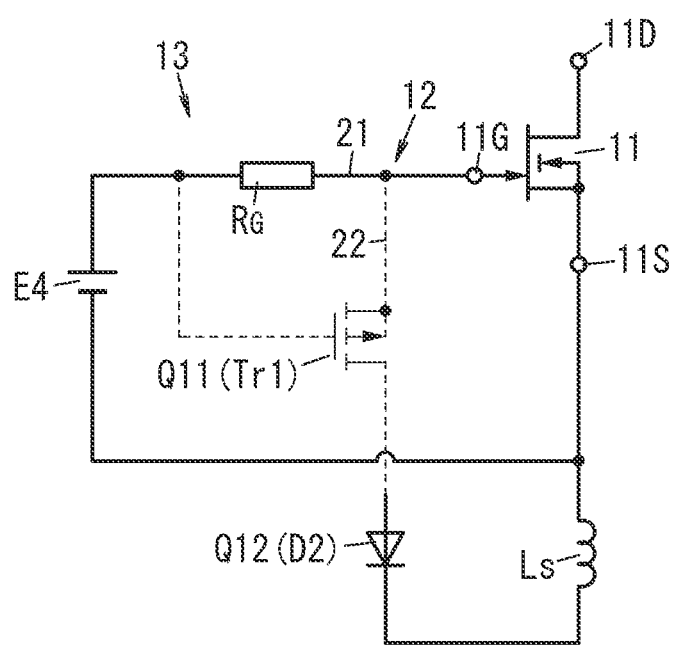
FIG. 18 illustrates how the control circuit operates.

In the switch system 13, while a positive bias voltage is output from the driver 14 to between the gate 11G and source 11S of the semiconductor switch 11 (note that the driver 14 is represented by a DC power supply E4 in FIG. 18), the semiconductor switch 11 is in ON state. At this time, in the p-channel field effect transistor Tr1, the potential at the gate is higher than the potential at the source, and therefore, the p-channel field effect transistor Tr1 is not electrically conductive.

To turn the semiconductor switch 11 OFF, the switch system 13 changes the output voltage of the driver 14 from a positive bias voltage into 0 V, for example, (or a negative bias voltage). As a result, the drain 11D-source 11S voltage $V_{DS}$, the principal current $I_{DS}$, and gate 11G-source 11S voltage $V_{GS}$ of the semiconductor switch 11 vary as shown in FIGS. 19B-21B.

Figure 19A:
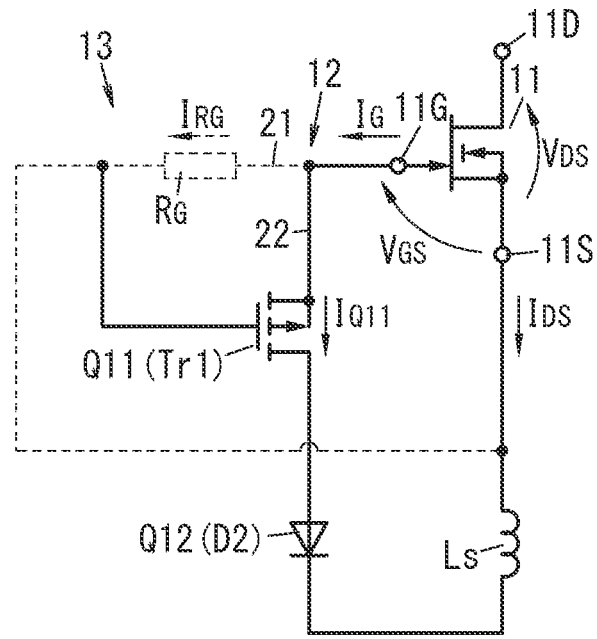
FIG. 19A illustrates how the control circuit operates.
Figure 19B:
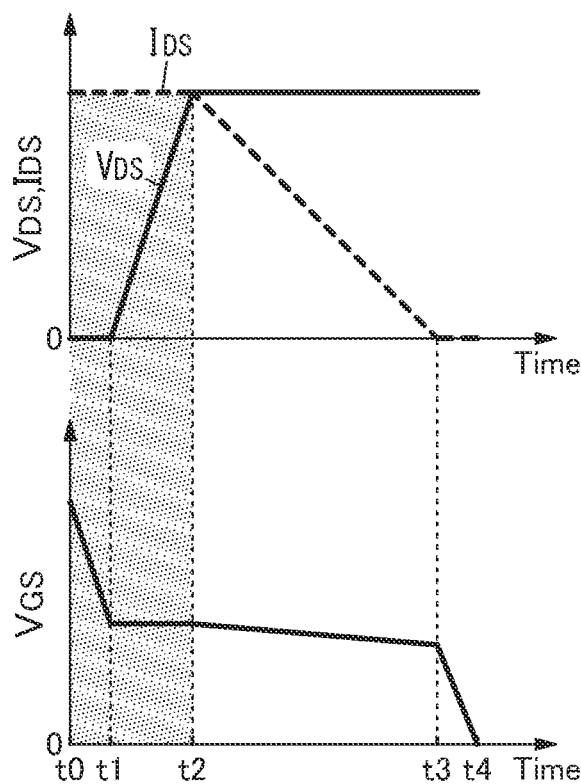
FIG. 19B is a waveform chart showing how the control circuit operates.

FIG. 19A illustrates how the control circuit 12 and the switch system 13h operate in the period from a point in time t0 to a point in time t2 shown in FIG. 19B (i.e., the period indicated by dot hatching in FIG. 19B). In FIG. 19B, t0 is the point in time when the switch system 13h changes the output voltage of the driver 14 from a positive bias voltage into, for example, 0 V (or a negative bias voltage) and t2 is a point in time when the drain 11D-source 11S voltage $V_{DS}$ of the semiconductor switch 11 finishes increasing. In the period from the point in time t0 through the point in time t2 shown in FIG. 19B, the first switch Q11 is ON and the second switch Q12 is ON, and therefore, the gate current $I_G$ is drained through the first switch Q11 and the second switch Q12. That is to say, the electric charge stored in the gate 11G of the semiconductor switch 11 is drained through the second discharge path 22. Thus, in the gate current $I_G$, the current $I_{Q11}$ flowing through the first switch Q11 is dominant. More specifically, in the period from the point in time t0 to the point in time t1 before the drain 11D-source 11S voltage $V_{DS}$ of the semiconductor switch 11 starts to increase, the electric charge in the gate 11G of the semiconductor switch 11 is drained rapidly, thus causing a steep decrease in the gate 11G-source 11S voltage $V_{GS}$ of the semiconductor switch 11. Then, once the drain 11D-source 11S voltage $V_{DS}$ of the semiconductor switch 11 has started to increase from the point in time t1, the gate 11G-source 11S voltage $V_{GS}$ becomes substantially constant.

Figure 20A:
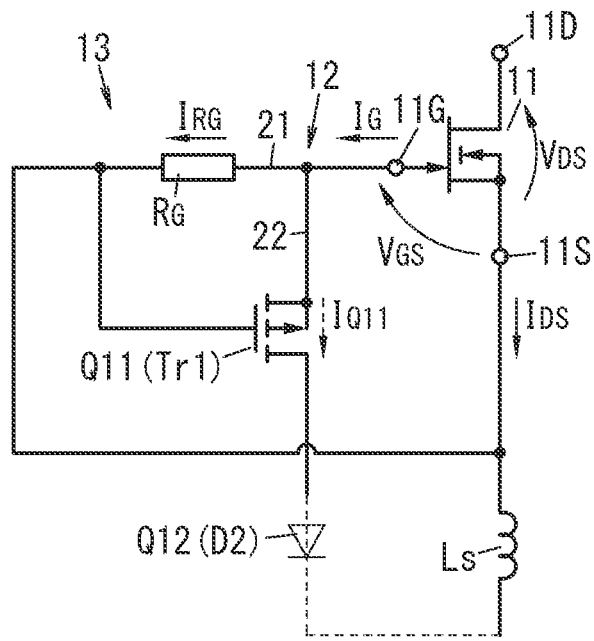
FIG. 20A illustrates how the control circuit operates.
Figure 20B:
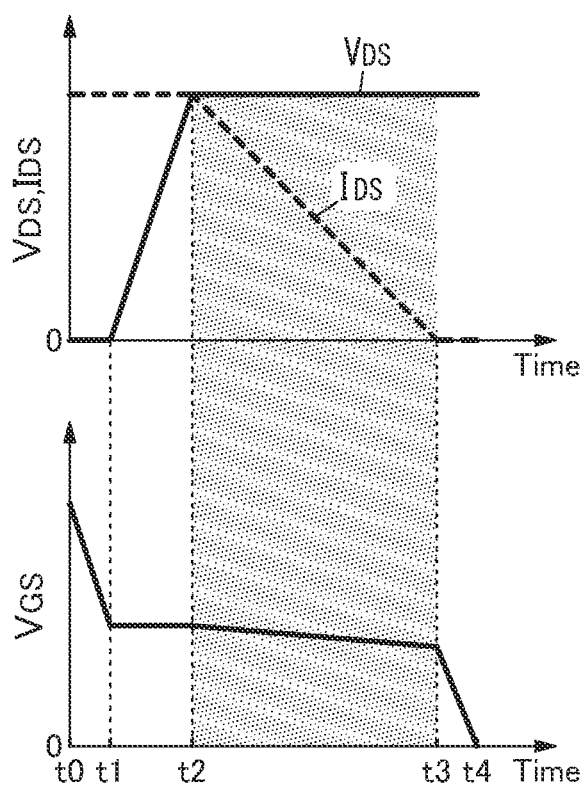
FIG. 20B is a waveform chart showing how the control circuit operates.

FIG. 20A illustrates how the control circuit 12 and the switch system 13h operate in the period from a point in time t2 to a point in time t3 shown in FIG. 20B (i.e., the period indicated by dot hatching in FIG. 20B). In the switch system 13, in the period from the point in time t2 to the point in time t3, the drain 11D-source 11S voltage $V_{DS}$ of the semiconductor switch 11 is substantially constant from the point in time t2 on as shown in FIG. 20B. As the principal current $I_{DS}$ starts to decrease from the point in time t2, electromotive force is generated between the first terminal and second terminal of the inductor Ls due to the variation in the principal current $I_{DS}$ to cause the diode D2 to turn OFF. As a result, the current $I_{Q11}$ flowing through the p-channel field effect transistor Tr1 decreases, and therefore, the gate current $I_G$ flows through the gate resistor $R_G$. That is to say, the electric charge in the gate 11G of the semiconductor switch 11 starts to be drained through the first discharge path 21, instead of the second discharge path 22. Thus, the magnitude of the gate current $I_G$ is determined by the resistance value of the gate resistor $R_G$. The resistance value of the gate resistor $R_G$ falls, for example, within the range from 50 Ω to 5 kΩ. If the resistance value of the gate resistor $R_G$ is a relatively large value (e.g., 3 kΩ or more), then the current variation rate $dI_{DS}/dt$ has a value derived by the following Equation (1)

$$L1 \times dI_{DS}/dt = V_{GS} - V_{thD2} \tag{1}$$

where L1 is the inductance of the inductor Ls and $V_{thD2}$ is a threshold voltage at which the diode D2 turns ON.

Figure 21A:
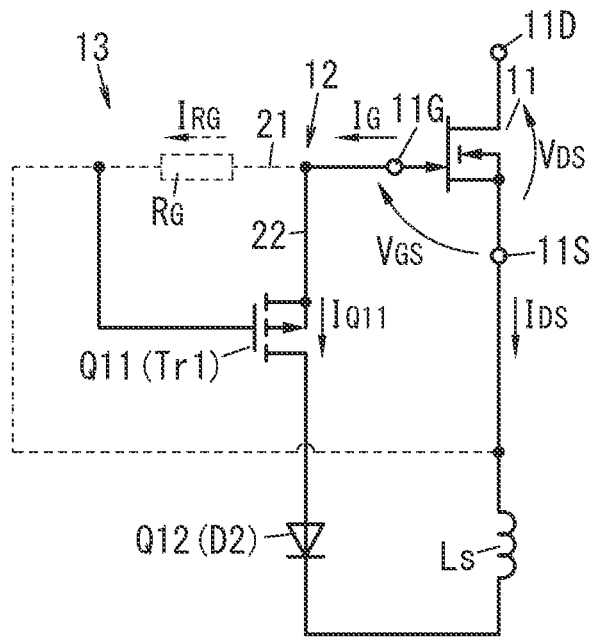
FIG. 21A illustrates how the control circuit operates.
Figure 21B:
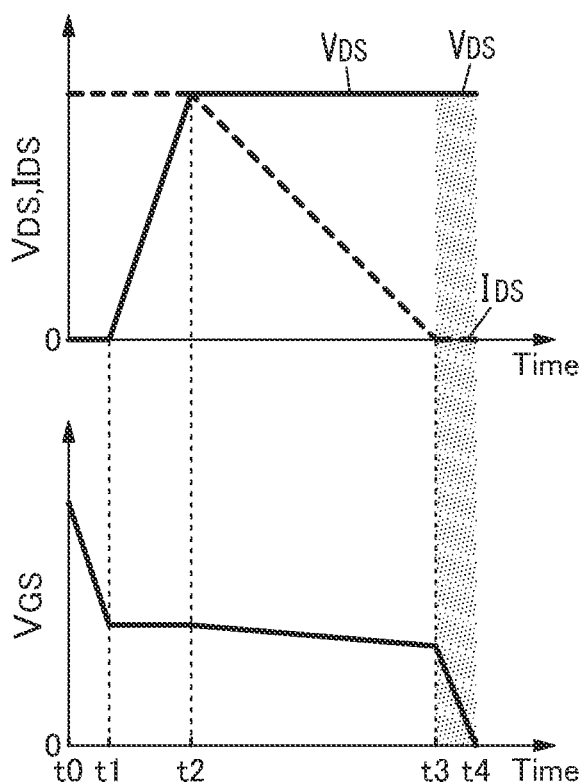
FIG. 21B is a waveform chart showing how the control circuit operates.

FIG. 21A illustrates how the control circuit 12 and the switch system 13 operate in the period from a point in time t3 to a point in time t4 shown in FIG. 21B (i.e., the period indicated by dot hatching in FIG. 21B). In the switch system 13, as shown in FIG. 21A, when the principal current $I_{DS}$ of the semiconductor switch 11 becomes approximately equal to zero at the point in time t3, no electromotive force is generated in the inductor Ls any longer and the second switch Q12 turns ON. Thus, the gate current $I_G$ starts to flow through the second discharge path 22 instead of the first discharge path 21. That is to say, in the gate current $I_G$, the current $I_{Q1}$ flowing through the first switch Q11 becomes dominant Thus, the electric charge in the gate of the semiconductor switch 11 is drained rapidly through the second discharge path 22. Consequently, the gate 11G-source 11S voltage $V_{GS}$ of the semiconductor switch 11 decreases steeply to become approximately equal to zero at the point in time t4.

Figure 22:
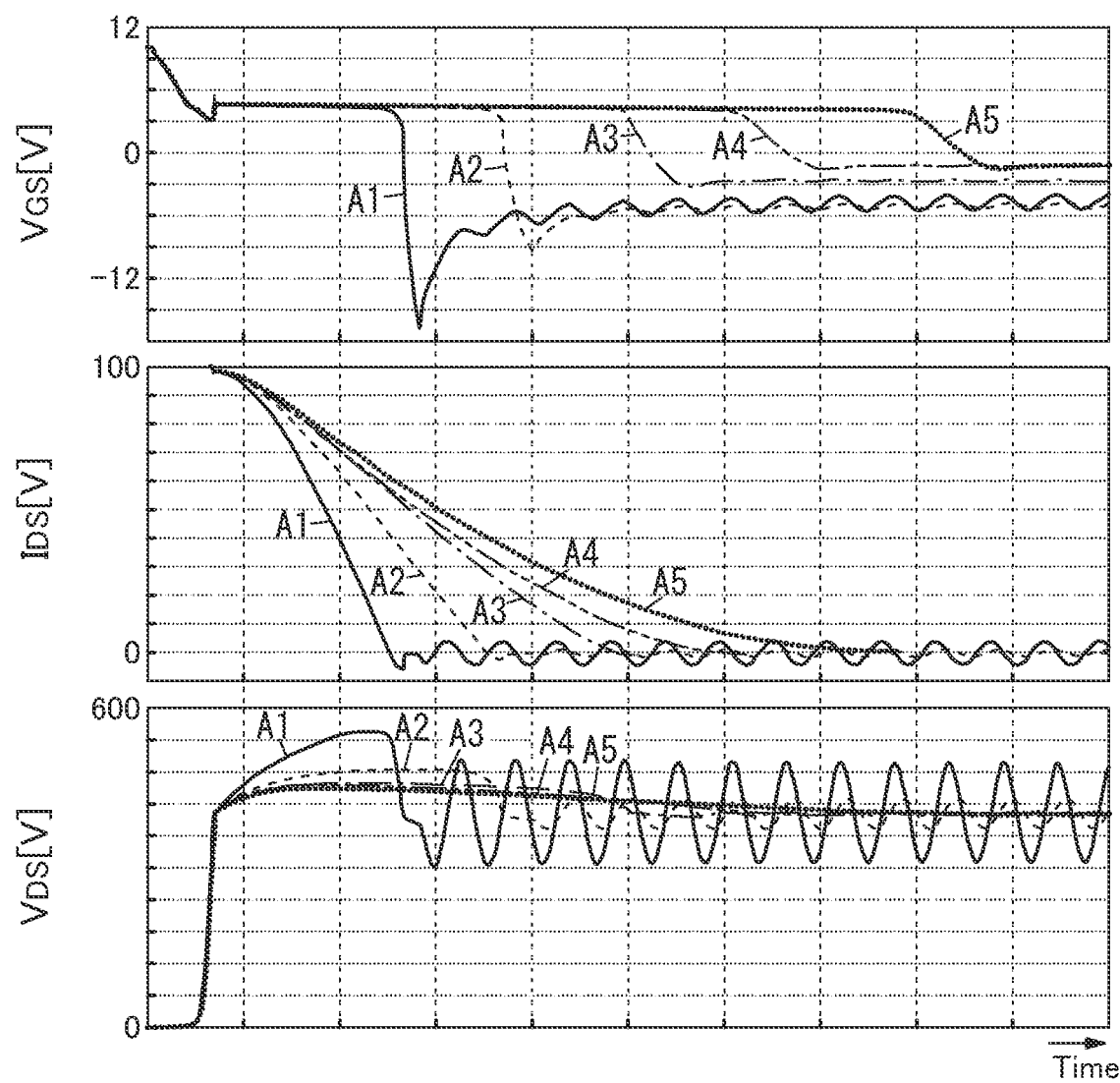
FIG. 22 is a characteristic diagram of a switch system including the control circuit.

(3) Characteristics of Semiconductor Switch to be Controlled by Control Circuit FIG. 22 shows the characteristics of the semiconductor switch 11 in a situation where the resistance value of the gate resistor $R_G$ is changed within the range from 100 Ω to 5 kΩ in the control circuit 12. In this case, the characteristics of the semiconductor switch 11 are represented by the variations with time in the gate 11G-source 11S voltage $V_{GS}$, principal current $I_{DS}$, and drain 11D-source 11S voltage $V_{DS}$ of the semiconductor switch 11. In FIG. 22, five characteristics of the semiconductor switch 11 are shown and are indicated by the reference signs A1, A2, A3, A4, and A5 in the ascending order of the resistance value of the gate resistor $R_G$. Specifically, in FIG. 22, A1 indicates the characteristic when the resistance value of the gate resistor $R_G$ is the smallest, and A5 indicates the characteristic when the resistance value of the gate resistor $R_G$ is the largest.

As can be seen from the results shown in FIG. 22, the control circuit 12 may change the current variation rate of the principal current $I_{DS}$ of the semiconductor switch 11 by varying the resistance value of the gate resistor $R_G$ and may decrease the absolute value of the current variation rate by increasing the resistance value. It can also be seen from the results shown in FIG. 22 that the control circuit 12 may reduce the respective oscillations of the gate 11G-source 11S voltage $V_{GS}$, principal current $I_{DS}$, and drain 11D-source 11S voltage $V_{DS}$ of the semiconductor switch 11 by increasing the resistance value of the gate resistor $R_G$. In addition, it can also be seen from the results shown in FIG. 22 that the control circuit 12 may reduce, by applying a negative bias voltage between the gate 11G and the source 11S of the semiconductor switch 11, the chances of the gate 11G-source 11S voltage $V_{GS}$ exceeding the threshold voltage to cause a false turn ON of the semiconductor switch 11.

(4) Advantages

The control circuit 12 according to the first example includes the first discharge path 21, the second discharge path 22, the first switch Q11, and the second switch Q12. The first discharge path 21 is connected to the gate 11G of the semiconductor switch 11. The second discharge path 22 is connected to the gate 11G of the semiconductor switch 11. The second discharge path 22 enables a more rapid discharge than the first discharge path 21. The second switch Q12 may be turned ON and OFF separately from the first switch Q11. The second switch Q12 is provided on the second discharge path 22 and selectively turns ON according to the current variation rate of a principal current $I_{DS}$ of the semiconductor switch 11. Thus, this control circuit 12 may reduce a surge voltage applied to the semiconductor switch 11 while cutting down the switching loss involved when the semiconductor switch 11 turns OFF.

The control circuit 12 drains the electric charge in the gate through the first discharge path 21 in the period from the point in time t2 to the point in time t3 during which the principal current $I_{DS}$ of the semiconductor switch 11 decreases when the semiconductor switch 11 turns OFF. This enables reducing the generation of the surge voltage due to the parasitic inductance of a load circuit connected to the semiconductor switch 11 and the current variation rate of the principal current $I_{DS}$. Also, the control circuit 12 drains the electric charge in the gate through the second discharge path 22, through which the electric charge may be drained more rapidly than through the first discharge path 21, in the periods other than the period from the point in time t2 to the point in time t3 (namely, the period from the point in time t1 to the point in time t2 and the period from the point in time t3 to the point in time t4) while the semiconductor switch 11 turns OFF. This contributes to shortening the turn-off time. This allows the control circuit 12 and the switch system 13 to reduce the chances of extending the switching time and cut down the switching loss even if the surge voltage is reduced by decreasing the absolute value of the current variation rate of the semiconductor switch 11.

In addition, in the control circuit 12, the first discharge path 21 includes the gate resistor $R_G$. This also enables, after a part of the electric charge has been drained from the gate 11G of the semiconductor switch 11 through the second discharge path 22, reducing the absolute value of the current variation rate of the principal current $I_{DS}$ when the residual electric charge is drained from the gate 11G of the semiconductor switch 11 through the first discharge path 21.

SECOND EXAMPLE

Figure 23:
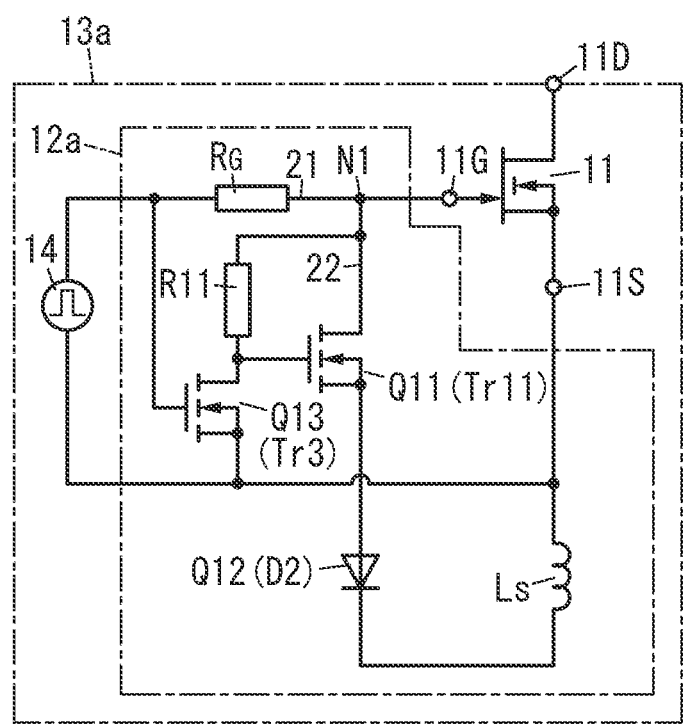
FIG. 23 is a circuit diagram of a switch system including a control circuit according to a second example.

Next, a control circuit 12a according to a second example and a switch system 13a including the control circuit 12a will be described with reference to FIG. 23.

The control circuit 12a according to the second example is almost the same as the control circuit 12 according to the first example (see FIG. 17) but includes, as the first switch Q11, an n-channel field effect transistor Tr11 instead of the p-channel field effect transistor Tr1, which is a difference from the control circuit 12 according to the first example. In the following description of the control circuit 12a and switch system 13a according to the second example, any constituent element of this second example, having the same function as a counterpart of the control circuit 12 and switch system 13 according to the first example described above, will be designated by the same reference numeral as that counterpart's, and description thereof will be omitted herein.

In the control circuit 12a according to the second example, the first switch Q11 is an n-channel field effect transistor Tr11 provided on the second discharge path 22.

The n-channel field effect transistor Tr11 includes a gate, a source, and a drain. The field effect transistor Tr11 (hereinafter also referred to as a "first field effect transistor Tr11") is a normally OFF n-channel MOSFET in the example illustrated in FIG. 23. Meanwhile, the second switch Q12 is a diode D2 provided on the second discharge path 22. The diode D2 includes an anode and a cathode.

In the control circuit 12a, the drain of the first field effect transistor Tr11 is connected to the gate 11G of the semiconductor switch 11 and the source of the first field effect transistor Tr11 is connected to the anode of the diode D2. The second discharge path 22 includes an inductor Ls which is connected in series to the diode D2. Thus, in the second discharge path 22, the first field effect transistor Tr11, the diode D2, and the inductor L1 are connected in series.

The control circuit 12a further includes a series circuit of a resistor R11 and a third switch Q13. The resistor R11 has a first terminal and a second terminal. The third switch Q13 is an n-channel field effect transistor Tr3. The n-channel field effect transistor Tr3 includes a gate, a source, and a drain. The field effect transistor Tr3 (hereinafter also referred to as a "third field effect transistor Tr3") is a normally OFF n-channel MOSFET in the example illustrated in FIG. 23. In the control circuit 12a, the first terminal of the resistor R11 is connected to the drain of the first field effect transistor Tr11 and the second terminal of the resistor R11 is connected to the drain of the third field effect transistor Tr3. The source of the third field effect transistor Tr3 is connected to the low-potential output terminal of the driver 14 and the source 11S of the semiconductor switch 11. The gate of the third field effect transistor Tr3 is connected to the high-potential output terminal of the driver 14. The gate of the first field effect transistor Tr11 is connected to a node between the second terminal of the resistor R11 and the drain of the third transistor Tr3.

In the switch system 13a, while a positive bias voltage is output from the driver 14 to between the gate 11G and source 11S of the semiconductor switch 11, the semiconductor switch 11 is in ON state. At this time, in the control circuit 12a, the third field effect transistor Tr3 is in ON state and the first field effect transistor Tr11 is in OFF state.

To turn the semiconductor switch 11 OFF, the switch system 13a changes the output voltage of the driver 14 from a positive bias voltage into 0 V, for example, (or a negative bias voltage). As a result, in the control circuit 12a, the third field effect transistor Tr3 turns OFF, the first field effect transistor Tr11 turns ON, and therefore, the electric charge in the gate 11G of the semiconductor switch 11 is drained through the second discharge path 22.

Thereafter, in the control circuit 12a, when the principal current $I_{DS}$ of the semiconductor switch 11 starts to decrease, electromotive force is generated between the first terminal and the second terminal of the inductor Ls due to the variation in the principal current $I_{DS}$ to cause the diode D2 to turn OFF. As a result, the current flowing through the first switch Q11 (i.e., the first field effect transistor Tr11) decreases, and therefore, the gate current $I_G$ (see FIG. 20) flows through the gate resistor $R_G$. That is to say, the electric charge in the gate 11G of the semiconductor switch 11 starts to be drained through the first discharge path 21, instead of the second discharge path 22. Thus, the magnitude of the gate current $I_G$ is determined by the resistance value of the gate resistor $R_G$.

Thereafter, in the control circuit 12a, when the principal current $I_{DS}$ of the semiconductor switch 11 becomes approximately equal to zero, no electromotive force is generated in the inductor Ls any longer and the second switch Q12 turns ON. Thus, the gate current $I_G$ starts to flow through the second discharge path 22 instead of the first discharge path 21. That is to say, in the gate current $I_G$, the current $I_{Q11}$ (see FIG. 21) flowing through the first switch Q11 becomes dominant. Thus, the electric charge in the gate of the semiconductor switch 11 is drained rapidly through the second discharge path 22. Consequently, the gate 11G-source 11S voltage $V_{GS}$ of the semiconductor switch 11 decreases steeply to become approximately equal to zero.

The control circuit 12a and the switch system 13a according to the second example, as well as the control circuit 12 and switch system 13 according to the first example, may reduce a surge voltage applied to the semiconductor switch 11 while cutting down the switching loss involved when the semiconductor switch 11 turns OFF.

In addition, in the switch system 13a according to the second example, a monolithic integrated circuit, in which the control circuit 12a including the first field effect transistor Tr11 and the third field effect transistor Tr3 and the semiconductor switch 11 are integrated together, may be easily provided by implementing each of the first field effect transistor Tr11 and the third field effect transistor Tr3 as an n-channel GaN-based GIT.

THIRD EXAMPLE

Next, a control circuit 12b according to a third example and a switch system 13b including the control circuit 12b will be described with reference to FIG. 24.

The control circuit 12b according to the third example is almost the same as the control circuit 12 according to the first example (see FIG. 17) but includes, as the second switch Q12, a normally ON n-channel field effect transistor Tr2 instead of the diode D2, which is a difference from the control circuit 12 according to the first example. In the following description of the control circuit 12b and switch system 13b according to the third example, any constituent element of this third example, having the same function as a counterpart of the control circuit 12 and switch system 13 according to the first example described above, will be designated by the same reference numeral as that counterpart's, and description thereof will be omitted herein.

In the control circuit 12b, the first switch Q11 is a p-channel field effect transistor Tr1 provided on the second discharge path 22 and the second switch Q12 is a normally ON n-channel field effect transistor Tr2 provided on the second discharge path 22. The second discharge path 22 includes an inductor Ls which is connected in series to the n-channel field effect transistor Tr2. In the second discharge path 22, the inductor Ls is connected to the source 11S of the semiconductor switch 11.

The normally ON n-channel field effect transistor Tr2 includes a gate, a source, and a drain. In the example illustrated in FIG. 24, the field effect transistor Tr2 is a normally ON n-channel GaN-based GIT.

The drain of the field effect transistor Tr2 is connected to the drain of the field effect transistor Tr1. The source of the field effect transistor Tr2 is connected to the first terminal of the inductor Ls. The gate of the field effect transistor Tr2 is connected to the second terminal of the inductor Ls. Thus, the gate of the field effect transistor Tr2 is connected to the low-potential output terminal of the driver 14 and the source 11S of the semiconductor switch 11.

In the switch system 13b, while a positive bias voltage is output from the driver 14 to between the gate 11G and source 11S of the semiconductor switch 11, the semiconductor switch 11 is in ON state. At this time, in the control circuit 12b, the field effect transistor Tr11 is in OFF state.

To turn the semiconductor switch 11 OFF, the switch system 13b changes the output voltage of the driver 14 from a positive bias voltage into 0 V, for example, (or a negative bias voltage). As a result, in the control circuit 12b, the field effect transistor Tr1 turns ON, and therefore, the electric charge in the gate 11G of the semiconductor switch 11 is drained through the second discharge path 22.

Thereafter, in the control circuit 12b, when the principal current $I_{DS}$ of the semiconductor switch 11 starts to decrease, electromotive force is generated between the first terminal and the second terminal of the inductor Ls due to the variation in the principal current $I_{DS}$ to cause the field effect transistor Tr2 to turn OFF. As a result, the current flowing through the field effect transistor Tr1 decreases, and therefore, the gate current $I_G$ (see FIG. 20) flows through the gate resistor $R_G$. That is to say, the electric charge in the gate 11G of the semiconductor switch 11 starts to be drained through the first discharge path 21, instead of the second discharge path 22. Thus, the magnitude of the gate current $I_G$ is determined by the resistance value of the gate resistor $R_G$.

Thereafter, in the control circuit 12b, when the principal current $I_{DS}$ of the semiconductor switch 11 becomes approximately equal to zero, no electromotive force is generated in the inductor Ls any longer and the second switch Q12 turns ON. Thus, the gate current $I_G$ starts to flow through the second discharge path 22 instead of the first discharge path 21. That is to say, in the gate current $I_G$, the current $I_{Q1}$ (see FIG. 21) flowing through the first switch Q11 becomes dominant Thus, the electric charge in the gate of the semiconductor switch 11 is drained rapidly through the second discharge path 22. Consequently, the gate 11G-source 11S voltage $V_{GS}$ of the semiconductor switch 11 decreases steeply to become approximately equal to zero.

The control circuit 12b and the switch system 13b according to the third example, as well as the control circuit 12 and switch system 13 according to the first example, may reduce a surge voltage applied to the semiconductor switch 11 while cutting down the switching loss involved when the semiconductor switch 11 turns OFF.

Figure 24:
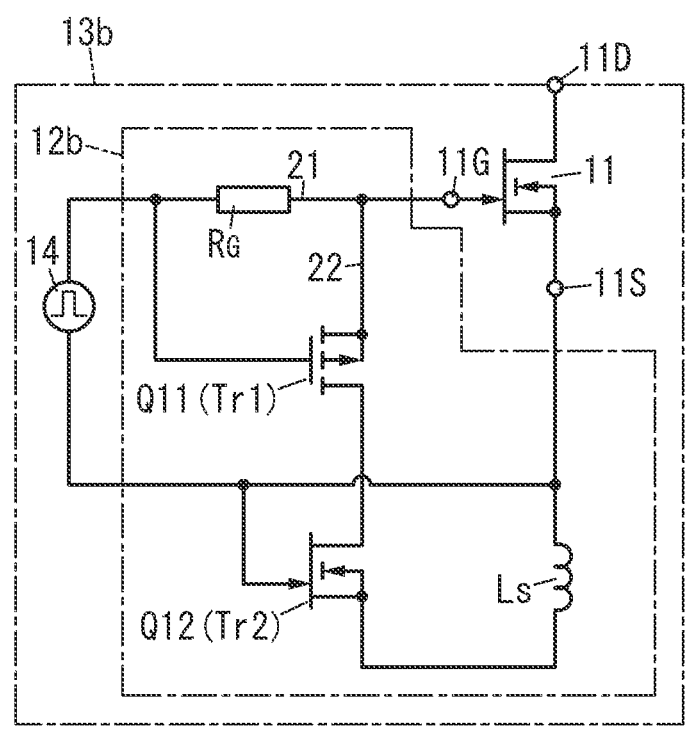
FIG. 24 is a circuit diagram of a switch system including a control circuit according to a third example.

In the example illustrated in FIG. 24, the field effect transistor Tr2 is a normally ON n-channel GaN-based GIT as described above. However, this is only an example and should not be construed as limiting. Alternatively, the field effect transistor Tr2 may also be a normally ON n-channel MOSFET.

FOURTH EXAMPLE

Figure 25:
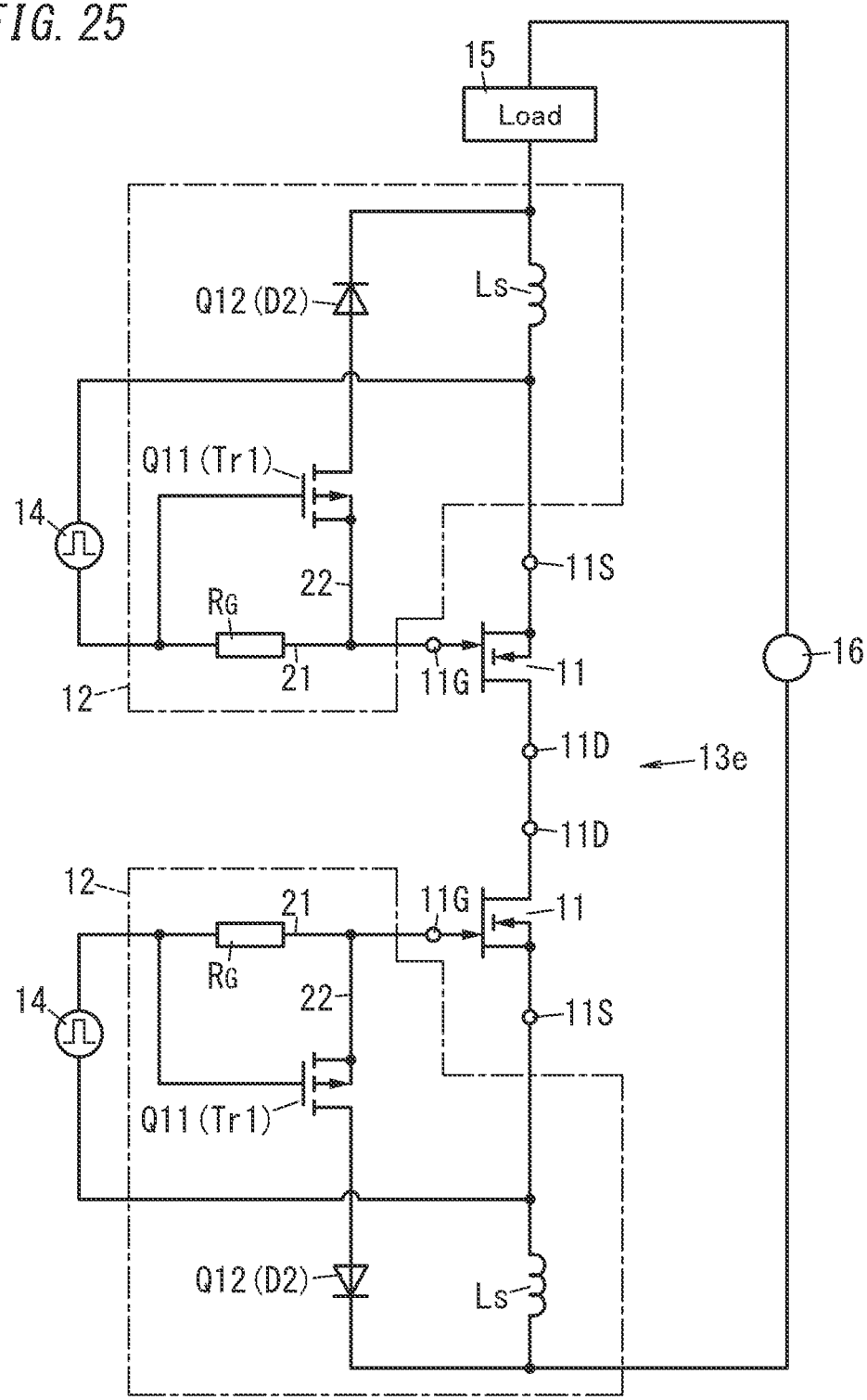
FIG. 25 is a circuit diagram of a switch system including a control circuit according to a fourth example.

Next, a switch system 13e according to a fourth example will be described with reference to FIG. 25.

The switch system 13e according to this fourth example includes two semiconductor switches 11 and two control circuits 12 of the switch system 13 according to the first example, which is a difference from the switch system 13 according to the first example. In the following description of the switch system 13e according to the fourth example, any constituent element, having the same function as a counterpart of the switch system 13 according to the first example described above, will be designated by the same reference numeral as that counterpart's, and description thereof will be omitted herein.

In the switch system 13e, the two semiconductor switches 11 are connected in series and the two control circuits 12 are associated one to one with the two semiconductor switches 11.

In the switch system 13e according to the fourth example, the respective drains 11D of the two semiconductor switches 11 are connected to each other.

In this switch system 13e, the polarity of the electromotive force generated in one of the two inductors Ls due to a variation in current is different from that of the electromotive force generated in the other inductor Ls due to the variation in current. In the inductor Ls connected to the source 11S of one of the two semiconductor switches 11, electromotive force is generated to cause the cathode of the diode D2 to have a higher potential than the source 11S. In the inductor Ls connected to the source 11S of the other semiconductor switch 11, electromotive force is generated to cause the cathode of the diode D2 to have a lower potential than the source 11S. Thus, the switch system 13e may reduce a surge voltage applied to the semiconductor switch 11 while cutting down the switching loss involved when the semiconductor switch 11, associated with the inductor Ls in which the electromotive force is generated to cause the cathode of the diode D2 to have a higher potential than the source 11S, turns OFF.

The switch system 13e according to the fourth example, as well as the switch system 13 according to the first example, may reduce a surge voltage applied to the semiconductor switch 11 while cutting down the switching loss involved when the semiconductor switch 11 turns OFF.

FIFTH EXAMPLE

Figure 26:
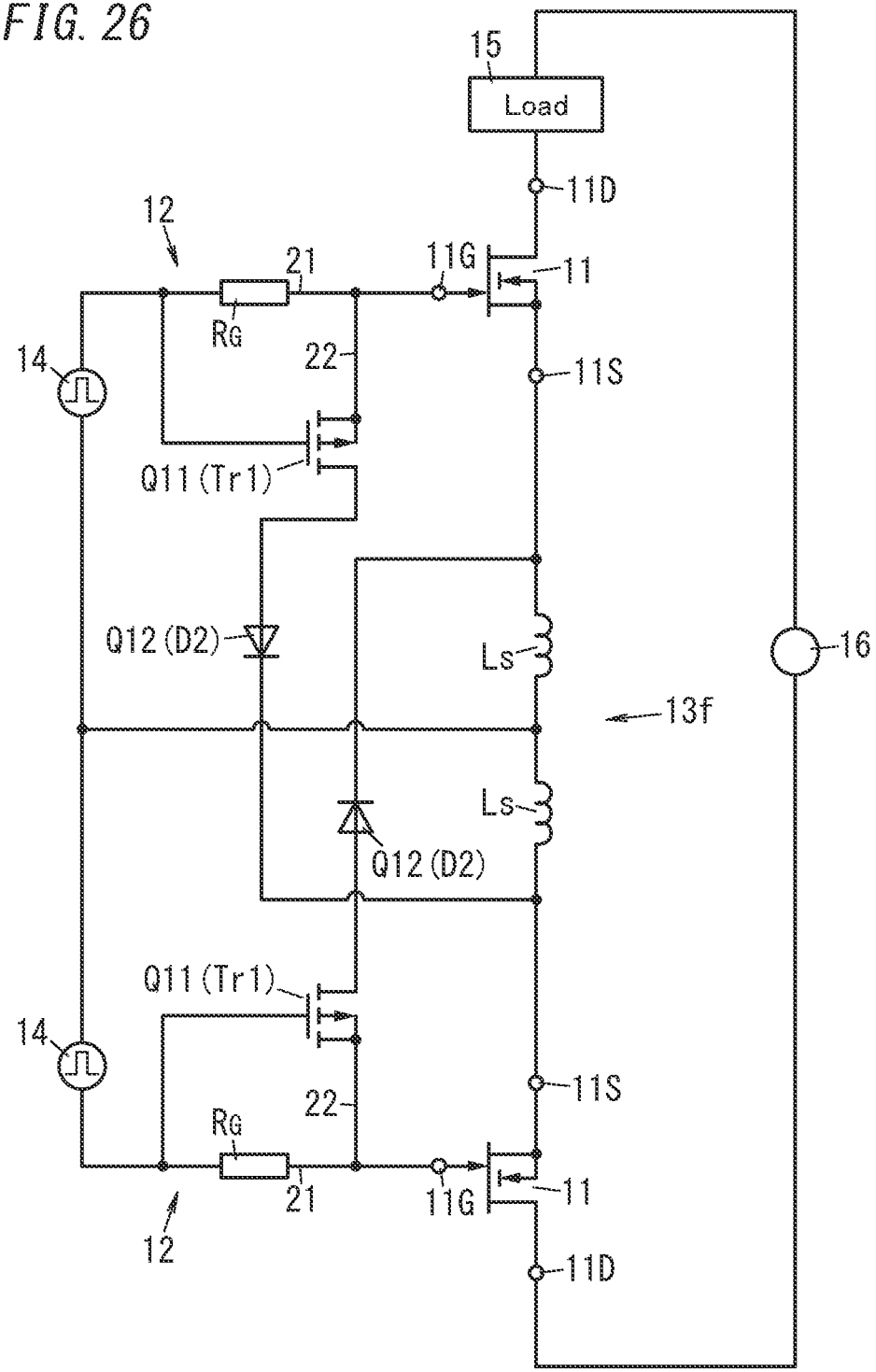
FIG. 26 is a circuit diagram of a switch system including a control circuit according to a fifth example.

Next, a switch system 13f according to a fifth example will be described with reference to FIG. 26.

The switch system 13f according to this fifth example includes two semiconductor switches 11 and two control circuits 12, which is a difference from the switch system 13 according to the first example. In the following description of the switch system 13f according to the fifth example, any constituent element, having the same function as a counterpart of the switch system 13 according to the first example described above, will be designated by the same reference numeral as that counterpart's, and description thereof will be omitted herein.

In the switch system 13f, the two semiconductor switches 11 are connected in series and the two control circuits 12 are associated one to one with the two semiconductor switches 11.

In the switch system 13f, the respective sources 11S of the two semiconductor switches 11 are connected via the respective inductors Ls of the two control circuits 12. Each of the two diode D2 of the two control circuits 12 is connected to the inductor Ls of an associated one of the two control circuits 12 via the inductor Ls of the control circuit 12 other than the associated one of the two control circuits 12.

The switch system 13f according to the fifth example, as well as the switch system 13 according to the first example, may reduce a surge voltage applied to the semiconductor switch 11 while cutting down the switching loss involved when the semiconductor switch 11 turns OFF.

The switch system 13f according to the fifth example includes two drivers 14 for the two control circuits 12 and the respective low-potential output terminals of the two drivers 14 are connected to each other. However, this is only an example and should not be construed as limiting. Alternatively, a single driver 14 may also be used in common for the two control circuits 12.

SIXTH EXAMPLE

Figure 27:
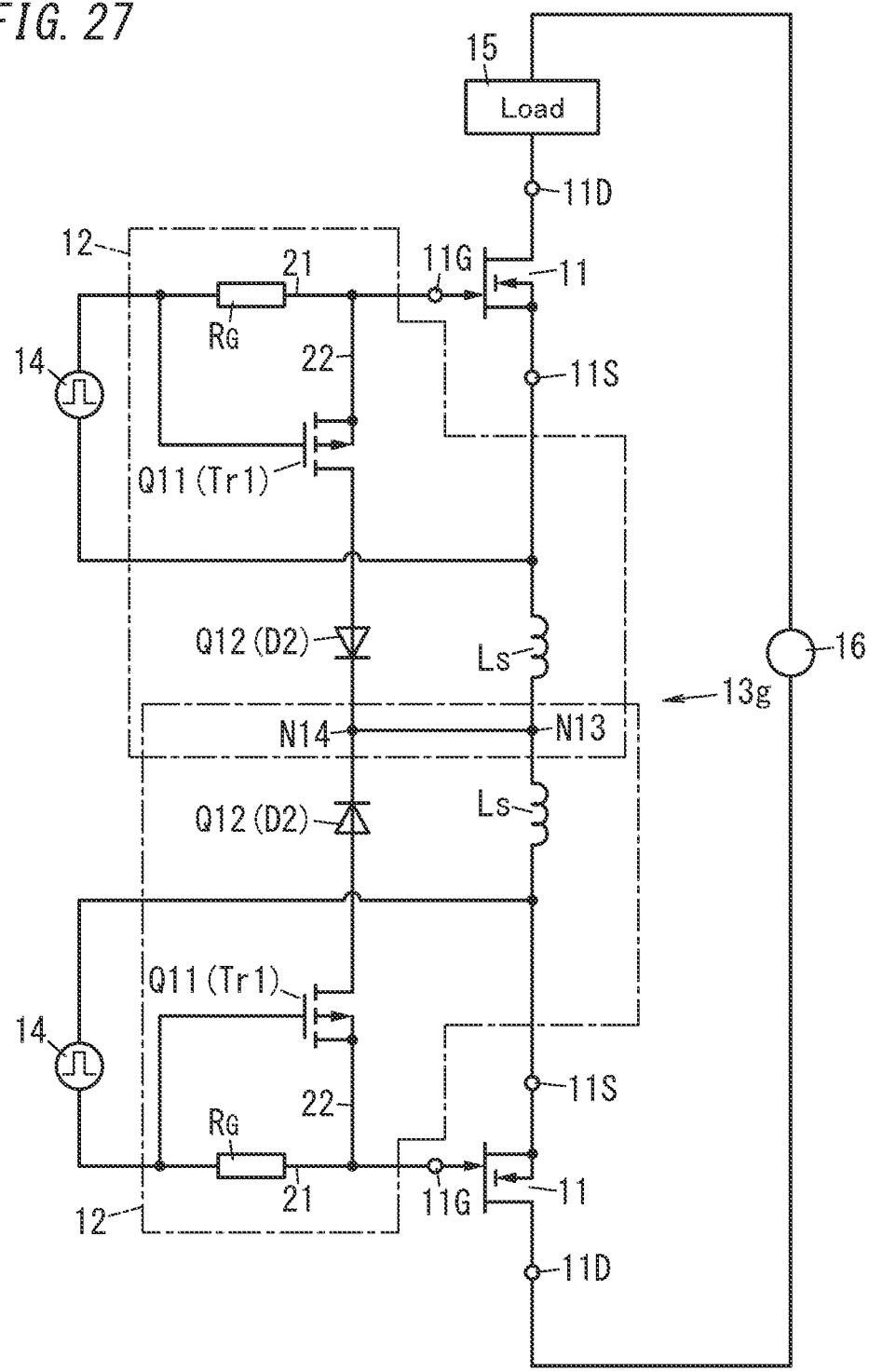
FIG. 27 is a circuit diagram of a switch system including a control circuit according to a sixth example.

Next, a switch system 13g according to a sixth example will be described with reference to FIG. 27.

The switch system 13g according to this sixth example includes two semiconductor switches 11 and two control circuits 12, which is a difference from the switch system 13 according to the first example. In the following description of the switch system 13g according to the sixth example, any constituent element, having the same function as a counterpart of the switch system 13 according to the first example described above, will be designated by the same reference numeral as that counterpart's, and description thereof will be omitted herein.

In the switch system 13g, the two semiconductor switches 11 are connected in series and the two control circuits 12 are associated one to one with the two semiconductor switches 11.

In the switch system 13g, the respective sources 11S of the two semiconductor switches 11 are connected via the respective inductors Ls of the two control circuits 12. In the switch system 13g, the respective sources 11S of the two semiconductor switches 11 are connected to each other. In the switch system 13g, a node N13 between the respective inductors Ls of the two control circuits 12 and a node N14 between the respective cathodes of the diodes D2 of the two control circuits 12 are connected to each other.

The switch system 13g according to the sixth example, as well as the switch system 13 according to the first example, may reduce a surge voltage applied to the semiconductor switch 11 while cutting down the switching loss involved when the semiconductor switch 11 turns OFF.

SEVENTH EXAMPLE

Figure 28:
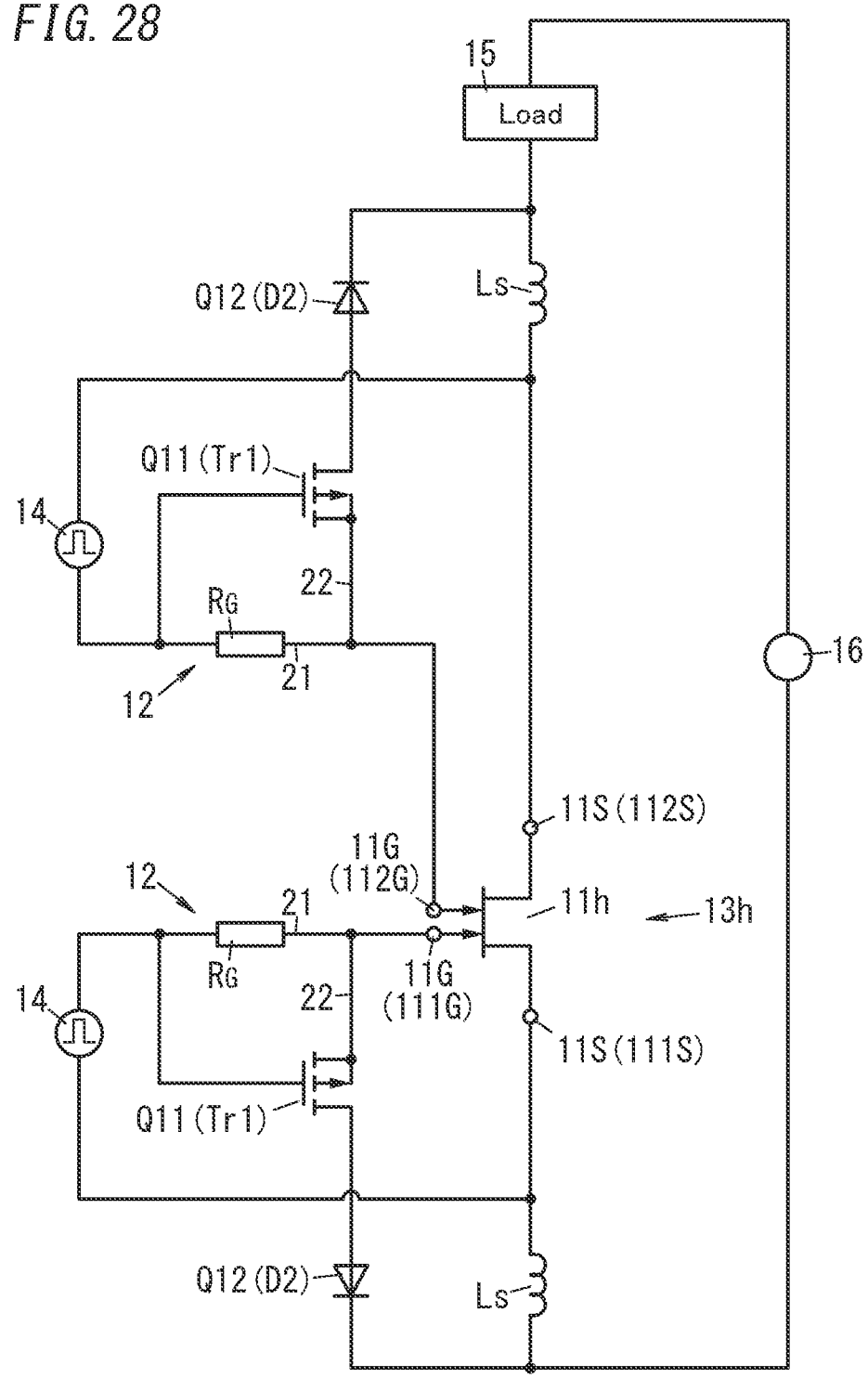
FIG. 28 is a circuit diagram of a switch system including a control circuit according to a seventh example.

Next, a switch system 13h according to a seventh example will be described with reference to FIG. 28.

The switch system 13h according to this seventh example includes a semiconductor switch 11h instead of the semiconductor switch 11 of the switch system 13e according to the fourth example, which is a difference from the switch system 13e according to the fourth example. The semiconductor switch 11h is a dual-gate bidirectional switch having two gates 11G and two sources 11S.

In the semiconductor switch 11h, the two gates 11G and the two sources 11S correspond one to one to each other. In the following description, one of the two gates 11G will be hereinafter referred to as a "first gate 111G" and the other gate 11G as a "second gate 112G" for the sake of convenience of description. In the same way, out of the two sources 11S, the source 11S corresponding to the first gate 111G will be hereinafter referred to as a "first source 111S" and the source 11S corresponding to the second gate 112G will be hereinafter referred to as a "second source 112S."

In the following description, the semiconductor switch 11h will be described briefly and then the switch system 13h will be described.

The semiconductor switch 11h is a type of GaN-based GIT. The semiconductor switch 11h includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The buffer layer is formed on the substrate. The first nitride semiconductor layer is formed on the buffer layer. The second nitride semiconductor layer is formed on the first nitride semiconductor layer. The first source electrode, the first gate electrode, the second gate electrode, and the second source electrode are formed on the second nitride semiconductor layer. The first p-type layer is interposed between the first gate electrode and the second nitride semiconductor layer. The second p-type layer is interposed between the second gate electrode and the second nitride semiconductor layer. In the semiconductor switch 11, the first source 111S includes the first source electrode. The first gate 111G includes the first gate electrode and the first p-type layer. The second gate 112G includes the second gate electrode and the second p-type layer. The second source 112S includes the second source electrode. The substrate is a silicon substrate, for example. The buffer layer is an undoped GaN layer, for example. The first nitride semiconductor layer is, for example, an undoped GaN layer. The second nitride semiconductor layer is, for example, an undoped AlGaN layer. Each of the first p-type layer and the second p-type layer is, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

In the semiconductor switch 11h, the second nitride semiconductor layer forms, along with the first nitride semiconductor layer, a heterojunction portion. In the first nitride semiconductor layer, a two-dimensional electron gas has been generated in the vicinity of the heterojunction portion. A region including the two-dimensional electron gas (hereinafter referred to as a "two-dimensional electron gas layer") may also serve as an n-channel layer (electron conduction layer).

Also, in the following description, a state where a voltage equal to or higher than a first threshold voltage (of 1.3 V, for example) is not applied between the first gate 111G and the first source 111S with the first gate 111G having the higher potential will be hereinafter referred to as a "state where the first gate 111G is OFF." Also, a state where a voltage equal to or higher than the first threshold voltage is applied between the first gate 111G and the first source 111S with the first gate 111G having the higher potential will be hereinafter referred to as a "state where the first gate 111G is ON."

Furthermore, a state where a voltage equal to or higher than a second threshold voltage (of 1.3 V, for example) is not applied between the second gate 112G and the second source 112S with the second gate 112G having the higher potential will be hereinafter referred to as a "state where the second gate 112G is OFF." Also, a state where a voltage equal to or higher than the second threshold voltage is applied between the second gate 112G and the second source 112S with the second gate 112G having the higher potential will be hereinafter referred to as a "state where the second gate 112G is ON."

This semiconductor switch 11h includes the first p-type layer and the second p-type layer described above, thus implementing a normally OFF transistor.

The semiconductor switch 11h may be switched from one of a bidirectionally ON state, a bidirectionally OFF state, a first diode state, or a second diode state to another depending on the combination of a first gate voltage applied to the first gate 111G and a second gate voltage applied to the second gate 112G. The first gate voltage is a voltage applied between the first gate 111G and the first source 111S. The second gate voltage is a voltage applied between the second gate 112G and the second source 112S. The bidirectionally ON state is a state where an electric current is allowed to pass bidirectionally (i.e., in a first direction and a second direction opposite from the first direction). The bidirectionally OFF state is a state where an electric current is blocked bidirectionally. The first diode state is a state where an electric current is allowed to pass in the first direction. The second diode state is a state where an electric current is allowed to pass in the second direction.

In a state where the first gate 111G is ON and the second gate 112G is ON, the semiconductor switch 11h turns into the bidirectionally ON state. In a state where the first gate 111G is OFF and the second gate 112G is OFF, the semiconductor switch 11h turns into the bidirectionally OFF state. In a state where the first gate 111G is OFF and the second gate 112G is ON, the semiconductor switch 11h turns into the first diode state. In a state where the first gate 111G is ON and the second gate 112G is OFF, the semiconductor switch 11h turns into the second diode state.

In the switch system 13h, the first discharge path 21 and the second discharge path 22 in one of the two control circuits 12 are connected to the first gate 111G, which is one of the two gates 11G, and the first discharge path 21 and the second discharge path 22 in the other control circuit 12 are connected to the second gate 112G, which is the other of the two gates 11G. In the switch system 13h, the inductor Ls of one of the two control circuits 12 is connected to the first source 111S, corresponding to the first gate 111G, out of the two sources 11S, and the inductor Ls of the other control circuit 12 is connected to the second source 112S, corresponding to the second gate 112G, out of the two sources 11S.

The switch system 13h according to the seventh example, as well as the switch system 13 according to the first example, may reduce a surge voltage applied to the semiconductor switch 11h while cutting down the switching loss involved when the semiconductor switch 11h turns OFF.

Note that the first to seventh examples described above are only exemplary ones of various examples of the present disclosure and should not be construed as limiting. Rather, the first through seventh examples may be readily modified in various manners depending on a design choice or any other factor without departing from the scope of the present disclosure.

Also, the p-type layer of the semiconductor switch 11 of the switch system 13h does not have to be the p-type AlGaN layer but may be, for example, a p-type GaN layer or a p-type metal-oxide semiconductor layer as well. The p-type metal-oxide semiconductor layer may be, for example, an NiO layer. The NiO layer may contain, as an impurity, at least one alkali metal selected from the group consisting of lithium, sodium, potassium, rubidium, and cesium. The NiO layer may also contain a transition metal such as silver or copper which becomes univalent when added as an impurity, for example. This statement for the p-type layer of the semiconductor switch 11 also applies to each of the first p-type layer and the second p-type layer of the semiconductor switch 11h of the switch system 13h.

Each of the semiconductor switch 11 and the semiconductor switch 11h may include one or more nitride semiconductor layers between the buffer layer and the first nitride semiconductor layer. Furthermore, the buffer layer does not have to have a single-layer structure but may also have, for example, a superlattice structure.

Furthermore, in each of the semiconductor switch 11 and the semiconductor switch 11h, the substrate does not have to be a silicon substrate but may also be, for example, a GaN substrate, an SiC substrate, or a sapphire substrate.

ASPECTS

The first to seventh examples and their variations described above may be specific implementations of the following aspects of the present disclosure.

A control circuit (12; 12a; 12b) according to a first aspect is a control circuit for controlling a semiconductor switch (11; 11h) including a gate (11G) and a source (11S) corresponding to the gate (11G). The control circuit (12; 12a; 12b) includes a first discharge path (21), a second discharge path (22), a first switch (Q11), and a second switch (Q12). The first discharge path (21) is connected to the gate (11G) of the semiconductor switch (11; 11h). The second discharge path (22) is connected to the gate (11G) of the semiconductor switch (11; 11h). The second discharge path (22) enables a more rapid discharge than the first discharge path (21). The second switch (Q12) may be turned ON and OFF separately from the first switch (Q11). The second switch (Q12) is provided on the second discharge path (22) and turns ON according to a current variation rate.

The control circuit (12; 12a; 12b) according to the first aspect may reduce a surge voltage applied to the semiconductor switch (11; 11h) while cutting down the switching loss involved when the semiconductor switch (11; 11h) turns OFF.

In a control circuit (12; 12a; 12b) according to a second aspect, which may be implemented in conjunction with the first aspect, the first switch (Q11) is provided on the second discharge path (22).

The control circuit (12; 12a; 12b) according to the second aspect allows electricity to be selectively discharged, according to the state of the first switch (Q11), through the second discharge path (22).

In a control circuit (12; 12a; 12b) according to a third aspect, which may be implemented in conjunction with the first or second aspect, the first switch (Q11) turns ON when the semiconductor switch (11; 11h) turns OFF.

The control circuit (12; 12a; 12b) according to the third aspect allows draining electric charge from the gate (11G) of the semiconductor switch (11; 11h) via the first switch (Q11) when the semiconductor switch (11; 11h) turns OFF.

In a control circuit (12) according to a fourth aspect, which may be implemented in conjunction with any one of the first to third aspects, the first switch (Q11) is a p-channel field effect transistor (Tr1) provided on the second discharge path (22). The second switch (Q12) is a diode (D2) provided on the second discharge path (22). The second discharge path (22) includes an inductor (Ls) connected in series to the diode (D2). In the second discharge path (22), the inductor (Ls) is connected to the source (11S) of the semiconductor switch (11; 11h).

The control circuit (12) according to the fourth aspect enables reducing the chances of causing voltage drop in each of the first switch (Q11) and the second switch (Q12).

In a control circuit (12a) according to a fifth aspect, which may be implemented in conjunction with any one of the first to third aspects, the first switch (Q11) is an n-channel field effect transistor (Tr11) provided on the second discharge path (22). The second switch (Q12) is a diode (D2) provided on the second discharge path (22). The second discharge path (22) includes an inductor (Ls) connected in series to the diode (D2). In the second discharge path (22), the inductor (Ls) is connected to the source (11S) of the semiconductor switch (11).

The control circuit (12a) according to the fifth aspect enables reducing the chances of causing voltage drop in each of the first switch (Q11) and the second switch (Q12).

In a control circuit (12b) according to a sixth aspect, which may be implemented in conjunction with any one of the first to third aspects, the first switch (Q11) is a p-channel field effect transistor (Tr1) provided on the second discharge path (22). The second switch (Q12) is a normally ON n-channel field effect transistor (Tr2) provided on the second discharge path (22). The second discharge path (22) includes an inductor (Ls) connected in series to the n-channel field effect transistor (Tr2). In the second discharge path (22), the inductor (Ls) is connected to the source (11S) of the semiconductor switch (11).

The control circuit (12b) according to the sixth aspect enables reducing the chances of causing voltage drop in each of the first switch (Q11) and the second switch (Q12).

In a control circuit (12) according to a seventh aspect, which may be implemented in conjunction with the first or second aspect, the first switch (Q11) turns ON when the semiconductor switch (11) turns ON.

In a control circuit (12; 12a; 12b) according to an eighth aspect, which may be implemented in conjunction with any one of the first to seventh aspects, the first discharge path (21) includes a gate resistor ($R_G$) connected to the gate (11G) of the semiconductor switch (11; 11h). The second discharge path (22) is connected to the gate (11G) of the semiconductor switch (11; 11h) not via the gate resistor ($R_G$).

The control circuit (12; 12a; 12b) according to the eighth aspect enables changing the current variation rate of the principal current ($I_{DS}$) of the semiconductor switch (11; 11h) by changing the resistance value of the gate resistor ($R_G$).

A switch system (13; 13a; 13b; 13e; 13g; 13h) according to a ninth aspect includes the control circuit (12; 12a; 12b) according to any one of the first to eighth aspects; and a semiconductor switch (11; 11h).

The switch system (13; 13a, 13b; 13e; 13g; 13h) according to the ninth aspect may reduce a surge voltage applied to the semiconductor switch (11; 11h) while cutting down the switching loss involved when the semiconductor switch (11; 11h) turns OFF.

A switch system (13e; 13f; 13g) according to a tenth aspect, which may be implemented in conjunction with the ninth aspect, includes two semiconductor switches (11) and two control circuits (12). In the switch system (13e; 13f; 13g), the two semiconductor switches (11) are connected in series. The two control circuits (12) are associated one to one with the two semiconductor switches (11).

The switch system (13e; 13f; 13g) according to the tenth aspect enables changing the current variation rate of the principal current ($I_{DS}$) of the semiconductor switch (11) by changing the resistance value of the gate resistor ($R_G$) with respect to each of the two semiconductor switches (11).

In a switch system (13e) according to an eleventh aspect, which may be implemented in conjunction with the tenth aspect, each of the two semiconductor switches (11) includes a drain (11D) corresponding to the gate (11G). In the switch system (13e), the respective drains (11D) of the two semiconductor switches (11) are connected to each other.

In a switch system (13f) according to a twelfth aspect, which may be implemented in conjunction with the tenth aspect, in each of the two control circuits (12), the first switch (Q11) is a p-channel field effect transistor (Tr1) provided on the second discharge path (22). In each of the two control circuits (12), the second switch (Q12) is a diode (D2) provided on the second discharge path (22). In each of the two control circuits (12), the second discharge path (22) includes an inductor (Ls) connected in series to the diode (D2). The inductor (Ls) is connected to the source (11S) of the semiconductor switch (11). In the switch system (13f), the respective sources (11S) of the two semiconductor switches (11) are connected to each other via the inductors (Ls) of the two control circuits (12). Each of the diodes (D2) of the two control circuits (12) is connected to the inductor (Ls) of an associated control circuit (12) via the inductor (Ls) of the other, non-associated control circuit (12) out of the two control circuits (12).

In a switch system (13g) according to a thirteenth aspect, which may be implemented in conjunction with the tenth aspect, in each of the two control circuits (12), the first switch (Q11) is a p-channel field effect transistor (Tr1) provided on the second discharge path (22). In each of the two control circuits (12), the second switch (Q12) is a diode (D2) provided on the second discharge path (22). In each of the two control circuits (12), the second discharge path (22) includes an inductor (Ls) connected in series to the diode (D2). The inductor (Ls) is connected to the source (11S) of its associated semiconductor switch (11). In the switch system (13g), the respective sources (11S) of the two semiconductor switches (11) are connected to each other via the inductors (Ls) of the two control circuits (12). In the switch system (13g), a node (N13) between the respective inductors (Ls) of the two control circuits (12) and a node (N14) between the respective cathodes of the diodes (D2) of the two control circuits (12) are connected to each other.

The switch system (13g) according to the thirteenth aspect allows a single driver (14) to be used in common for the two control circuits (12).

In a switch system (13h) according to a fourteenth aspect, which may be implemented in conjunction with the ninth aspect, the semiconductor switch (11) is a dual-gate bidirectional switch including two gates (11G) and two sources (11S). The switch system (13h) includes two control circuits (12). In the switch system (13h), one control circuit (12) out of the two control circuits (12) is connected to a first gate (111G), which is one gate (11G) out of the two gates (11G), and the other control circuit (12) is connected to a second gate (112G), which is the other gate (11G) out of the two gates (11G).

REFERENCE SIGNS LIST 1, 1k Switching Element
5 Circuit Element
10, 10a, 10b, 10c, 10d, 10e1, 10e2, 10f1, 10f2, 10g1, 10g2, 10h, 10i, 10j Control Circuit
100, 100a, 100b, 100c, 100d, 100e, 100f, 100g, 100h, 100i, 100j, 100k Switch Device
D1 Drain
Di1 Diode
Di2 Protective Diode
Di3 Protective Diode
Dis Diode
G1 Gate
L1 Inductor
P0 Reference Potential Point
R1 Resistor
S1, S2 Source
11 Semiconductor Switch
11D Drain
11G Gate
111G First Gate
112G Second Gate
11S Source
111S First Source
112S Second Source
12, 12a, 12b Control Circuit
21 First Discharge Path
22 Second Discharge Path
13, 13a, 13b, 13e, 13f, 13g, 13h Switch System
14 Driver
N11 Node
N12 Node
N13 Node
N14 Node
D2 Diode
Ls Inductor
$R_G$ Gate Resistor
Tr1 p-Channel Field Effect Transistor
Tr11 Field Effect Transistor
Tr2 Normally ON n-Channel Field Effect Transistor

The invention claimed is:

1. A control circuit configured to control a switching element, the switching element including a gate and a source corresponding to the gate, the control circuit comprising:
   an inductor connected between the gate and the source of the switching element;
   a circuit element connected in series to the inductor between the gate and the source and configured to allow an electric current to flow therethrough in response to generation of electromotive force in the inductor; and
   a resistor connected in parallel to the inductor and the circuit element between the gate and the source,
   wherein
   the circuit element includes a resistor.

2. The control circuit of claim 1, wherein
   when the switching element turns OFF, an electric current flowing through the source of the switching element decreases to generate electromotive force in the inductor, cause an electric current corresponding to the electromotive force to flow through the circuit element and the resistor, and thereby cause an increase in a potential at a reference potential point included in a path between a point of connection where the circuit element and the resistor are connected together and the gate, and an amount of an electric current flowing through the path from the gate varies according to a potential difference between a potential at the gate and the potential at the reference potential point.

3. The control circuit of claim 1, further comprising a protective diode, the protective diode including an anode and a cathode, having the anode connected between the source of the switching element and a node located between the inductor and the resistor, and having the cathode connected to the gate of the switching element.

4. A switch device comprising:
the control circuit of claim 1; and
the switching element.

5. The switch device of claim 4, wherein
the switch device includes two switching elements, each of the two switching elements being the switching element,
the switch device includes two control circuits, each of the two control circuits being the control circuit,
the two switching elements are connected in series, and
the two control circuits are associated one to one with the two switching elements.

6. The switch device of claim 5, wherein
each of the two switching elements includes a drain corresponding to the gate, and
the respective drains of the two switching elements are connected to each other.

7. The switch device of claim 5, wherein the respective sources of the two switching elements are connected to each other.

8. A control circuit configured to control a switching element, the switching element including a gate and a source corresponding to the gate, the control circuit comprising:
an inductor connected between the gate and the source of the switching element;
a circuit element connected in series to the inductor between the gate and the source and configured to allow an electric current to flow therethrough in response to generation of electromotive force in the inductor;
a resistor connected in parallel to the inductor and the circuit element between the gate and the source; and
a protective diode, the protective diode including an anode and a cathode, having the anode connected to a point of connection between the circuit element and the resistor, and having the cathode connected to the gate of the switching element.

9. The control circuit of claim 8, wherein the circuit element includes a capacitor.

10. The control circuit of claim 8, wherein the circuit element includes a diode.

11. The control circuit of claim 8, wherein the circuit element includes a resistor.

12. The control circuit of claim 8, wherein
when the switching element turns OFF, an electric current flowing through the source of the switching element decreases to generate electromotive force in the inductor, cause an electric current corresponding to the electromotive force to flow through the circuit element and the resistor, and thereby cause an increase in a potential at a reference potential point included in a path between a point of connection where the circuit element and the resistor are connected together and the gate, and
an amount of an electric current flowing through the path from the gate varies according to a potential difference between a potential at the gate and the potential at the reference potential point.

13. A control circuit configured to control a switching element, the switching element including a gate and a source corresponding to the gate, the control circuit comprising:
an inductor connected between the gate and the source of the switching element;
a circuit element connected in series to the inductor between the gate and the source and configured to allow an electric current to flow therethrough in response to generation of electromotive force in the inductor;
a resistor connected in parallel to the inductor and the circuit element between the gate and the source;
a first terminal connected to the switching element at a point, located opposite from the source, of the switching element;
a second terminal connected to the inductor at a point, located opposite from the switching element, of the inductor;
a second inductor connected between a first node and the circuit element, the first node being located between a first inductor serving as the inductor and the second terminal;
a voltage clamping element connected in parallel to the switching element, the first inductor, and the second inductor; and
a third inductor connected between a second node and the voltage clamping element, the second node being located between the second inductor and the circuit element, wherein
no electric current flows through the third inductor while the switching element is in ON state.

14. The control circuit of claim 13, wherein the circuit element includes a resistor.

15. The control circuit of claim 13, wherein
when the switching element turns OFF, an electric current flowing through the source of the switching element decreases to generate electromotive force in the inductor, cause an electric current corresponding to the electromotive force to flow through the circuit element and the resistor, and thereby cause an increase in a potential at a reference potential point included in a path between a point of connection where the circuit element and the resistor are connected together and the gate, and
an amount of an electric current flowing through the path from the gate varies according to a potential difference between a potential at the gate and the potential at the reference potential point.

16. A switch device comprising:
a control circuit configured to control a switching element, the switching element including a gate and a source corresponding to the gate; and
the switching element,
the control circuit comprising:
an inductor connected between the gate and the source of the switching element;
a circuit element connected in series to the inductor between the gate and the source and configured to allow an electric current to flow therethrough in response to generation of electromotive force in the inductor; and
a resistor connected in parallel to the inductor and the circuit element between the gate and the source;

the switching element is a dual-gate bidirectional switch including two gates and two sources, each of the two gates being the gate, each of the two sources being the source, the switch device includes two control circuits, each of the two control circuits being the control circuit, and one control circuit out of the two control circuits is connected to a gate, associated with the one control circuit, out of the two gates of the bidirectional switch, and the other control circuit out of the two control circuits is connected to a gate, associated with the other control circuit, out of the two gates of the bidirectional switch.

\* \* \* \* \*